US009530510B2

(12) United States Patent
Shiino et al.

(10) Patent No.: US 9,530,510 B2
(45) Date of Patent: Dec. 27, 2016

(54) NONVOLATILE SEMICONDUCTOR MEMORY DEVICE

(71) Applicant: KABUSHIKI KAISHA TOSHIBA, Minato-ku (JP)

(72) Inventors: Yasuhiro Shiino, Yokohama (JP); Eietsu Takahashi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/945,569

(22) Filed: Nov. 19, 2015

(65) Prior Publication Data

US 2016/0071602 A1    Mar. 10, 2016

Related U.S. Application Data

(63) Continuation of application No. 14/295,923, filed on Jun. 4, 2014, now Pat. No. 9,214,237, which is a
(Continued)

(30) Foreign Application Priority Data

Sep. 16, 2009  (JP) ................................ 2009-214143
Feb. 10, 2010  (JP) ................................ 2010-028109

(51) Int. Cl.
*G11C 16/04*    (2006.01)
*G11C 16/14*    (2006.01)
(Continued)

(52) U.S. Cl.
CPC .......... *G11C 16/14* (2013.01); *G11C 11/5635* (2013.01); *G11C 16/0483* (2013.01); *G11C 16/10* (2013.01);
(Continued)

(58) Field of Classification Search
CPC ..... G11C 16/10; G11C 16/0483; G11C 16/26; G11C 16/14; G11C 16/3459; G11C 11/5628; G11C 16/08; G11C 16/0466; G11C 16/16; G11C 11/5642; G11C 16/24; G11C 16/0408; G11C 16/3445
(Continued)

(56) References Cited

U.S. PATENT DOCUMENTS 8,199,579 B2    6/2012  Shiino et al.
2003/0035316 A1    2/2003  Tanaka et al.
(Continued)

FOREIGN PATENT DOCUMENTS

JP    11-176175    7/1999
JP    2008-305536    12/2006
(Continued)

OTHER PUBLICATIONS

Japanese Office Action, mailed Jan. 17, 2012, for Japanese Application No. 2009-214143, with English translation.

*Primary Examiner* — Thong Q Le
(74) *Attorney, Agent, or Firm* — Oblon, McClelland, Maier & Neustadt, L.L.P.

(57) ABSTRACT

A nonvolatile semiconductor memory device includes a control circuit configured to control a soft program operation of setting nonvolatile memory cells to a first threshold voltage distribution state of the nonvolatile memory cells. When a characteristic of the nonvolatile memory cells is in a first state, the control circuit executes the soft program operation by applying a first voltage for setting the nonvolatile memory cells to the first threshold voltage distribution state to first word lines, and applying a second voltage higher than the first voltage to a second word line. When the characteristic of the nonvolatile memory cells is in a second state, the control circuit executes the soft program operation
(Continued)

by applying a third voltage equal to or lower than the first voltage to the first word lines and applying a fourth voltage lower than the second voltage to the second word line.

16 Claims, 15 Drawing Sheets

Related U.S. Application Data continuation of application No. 14/066,875, filed on Oct. 30, 2013, now Pat. No. 8,787,091, which is a continuation of application No. 13/457,560, filed on Apr. 27, 2012, now Pat. No. 8,599,617, which is a continuation of application No. 12/878,624, filed on Sep. 9, 2010, now Pat. No. 8,199,579.

(51) Int. Cl.
    *G11C 11/56* (2006.01)
    *G11C 16/16* (2006.01)
    *G11C 16/34* (2006.01)
    *G11C 16/10* (2006.01)

(52) U.S. Cl.
    CPC ........... *G11C 16/16* (2013.01); *G11C 16/3404* (2013.01); *G11C 16/344* (2013.01); *G11C 16/3413* (2013.01); *G11C 16/3445* (2013.01); *G11C 16/3463* (2013.01); *G11C 2211/5621* (2013.01)

(58) Field of Classification Search
    USPC .......... 365/185.18, 185.11, 185.29, 185.12, 365/185.17, 185.03, 185.19, 185.22, 185.25, 365/185.02, 185.21, 185.05, 185.2, 185.24
    See application file for complete search history.

(56) References Cited

U.S. PATENT DOCUMENTS

| | | |
|---|---|---|
| 2006/0274583 A1 | 12/2006 | Lutze |
| 2008/0137422 A1 | 6/2008 | Hosono |
| 2008/0304326 A1 | 12/2008 | Kim et al. |
| 2009/0185421 A1 | 7/2009 | Yun et al. |
| 2010/0246265 A1* | 9/2010 | Moschiano ......... G11C 11/5635 365/185.11 |
| 2010/0259987 A1 | 10/2010 | Lee et al. |

FOREIGN PATENT DOCUMENTS

| | | |
|---|---|---|
| JP | 2007-272952 | 10/2007 |
| JP | 2008-027511 | 2/2008 |
| JP | 2008-084471 | 4/2008 |
| JP | 2008-140488 | 6/2008 |

\* cited by examiner

THRESHOLD VOLTAGE AFTER
SOFT PROGRAM OPERATION
(INITIAL STATE)

THRESHOLD VOLTAGE AFTER
PRE-PROGRAM OPERATION
(DETERIORATED STATE)

THRESHOLD VOLTAGE AFTER
PRE-PROGRAM OPERATION

NONVOLATILE SEMICONDUCTOR MEMORY DEVICE

CROSS REFERENCE TO RELATED APPLICATIONS

This application is a continuation of and claims the benefit of priority under 35 U.S.C. §120 from U.S. Ser. No. 14/295,923, filed Jun. 4, 2014 which is a continuation of U.S. Ser. No. 14/066,875, filed Oct. 30, 2013, now U.S. Pat. No. 8,787,091, which is a continuation of U.S. Ser. No. 13/457,560, filed Apr. 27, 2012, now U.S. Pat. No. 8,599,617, which is a continuation of U.S. Ser. No. 12/878,624, filed Sep. 9, 2010, now U.S. Pat. No. 8,199,579 and claims the benefit of priority from prior Japanese Patent Application Nos. 2009-214143, filed on Sep. 16, 2009, and No. 2010-28109, filed on Feb. 10, 2010, the entire contents of each of which are incorporated herein by reference.

BACKGROUND

Field

Embodiments described herein relates to a nonvolatile semiconductor memory device configured with nonvolatile memory cells that are electrically rewritable.

Description of the Related Art

NAND type flash memory is known as nonvolatile semiconductor memory device that is electrically rewritable and suitable for high integration. In NAND type flash memory, a plurality of memory cells are connected in series in a way that the source diffused layer of one memory cell is shared as the drain diffused layer of its adjoining memory cell, thereby forming a NAND cell unit. Both ends of the NAND cell unit are connected to a bit line and a source line respectively via select gate transistors. Such a NAND cell unit configuration enables large-capacity storage with a smaller unit cell area than that of a NOR type memory.

A memory cell of a NAND type flash memory includes a charge accumulation layer (floating gate electrode) provided above a semiconductor substrate via a tunnel insulating film and a control gate electrode stacked above the floating gate electrode via an inter-gate insulating film, and stores data in a nonvolatile manner in accordance with the charge accumulation state of the floating gate electrode. For example, a memory cell executes binary data storage by defining, for example, a high threshold voltage state in which electrons are into the floating gate electrode as data "0", and defining a low threshold voltage state in which electrons in the floating gate electrode are discharged as data "1". Recently, multi-value storage of four-value, eight-value, and so on is also undertaken by subdividing a threshold voltage distribution for writing.

A data writing operation of a NAND type flash memory is executed on a page basis. A page is configured by memory cells arranged along a selected word line. Specifically, a writing operation is executed as an operation of supplying a writing voltage to a selected word line and injecting electrons into the floating gate electrode from a cell channel by the effect of FN tunneling. In this case, the potential of the cell channel is controlled in accordance with data "0" or "1" that is to be written.

That is, when data "0" is to be written, a voltage Vss is supplied to the bit line and transferred to the channel of the selected memory cell via a select gate transistor which is conductive. At this time, in the selected memory cell, a high electrical field is applied between the floating gate electrode and the channel to cause electrons to be injected into the floating gate electrode. On the other hand, when data "1" is to be written (i.e., in the case of non-writing), a supply voltage Vdd is supplied to the bit line to charge the cell channel up to a voltage Vdd-Vth (where Vth is the threshold voltage of the select gate transistor), after which the select gate transistor becomes non-conductive state to turn the cell channel into a floating state. At this time, the potential of the cell channel rises due to the effect of capacitance coupling with the word line, thereby inhibiting electrons from being injected into the floating gate electrode.

Recently, as the minimum feature size has become increasingly smaller, the effect caused by capacitance coupling between the floating gate electrodes of adjoining memory cells (inter-cell interference), etc. has become more significant. This effect might cause undesirable dispersion of the threshold voltages of memory cells (writing error and erase error). Particularly, when a memory cell at the end of the NAND cell unit is directly connected to a select gate transistor, there may occur dispersion between the memory cell at the end of the NAND cell unit and the other memory cells in regard to their operation characteristic, increasing the possibility of erroneous writing and erase error. An effective measure for this problem is a method of providing a dummy cell that is not used for data storage at a location adjoining the select gate transistor.

Further, a method of executing a so-called soft program operation is known for solving an over-erased state of the memory cells subsequent to simultaneous erasing. The soft program operation is important for preventing a change of data due to capacitance coupling between the floating gate electrodes of adjoining memory cells. Especially, this operation is critical as a countermeasure technique against writing error in case of shrinking of a NAND type flash memory.

In a nonvolatile semiconductor memory such as a NAND type flash memory, etc., it is preferred to suppress dispersion of the threshold voltages of the nonvolatile memory cells before an erasing operation is executed. Hence, it is proposed that a weak writing operation called pre-program operation be executed before an erasing operation is executed.

DETAILED DESCRIPTION OF THE EMBODIMENTS

Figure 1A:
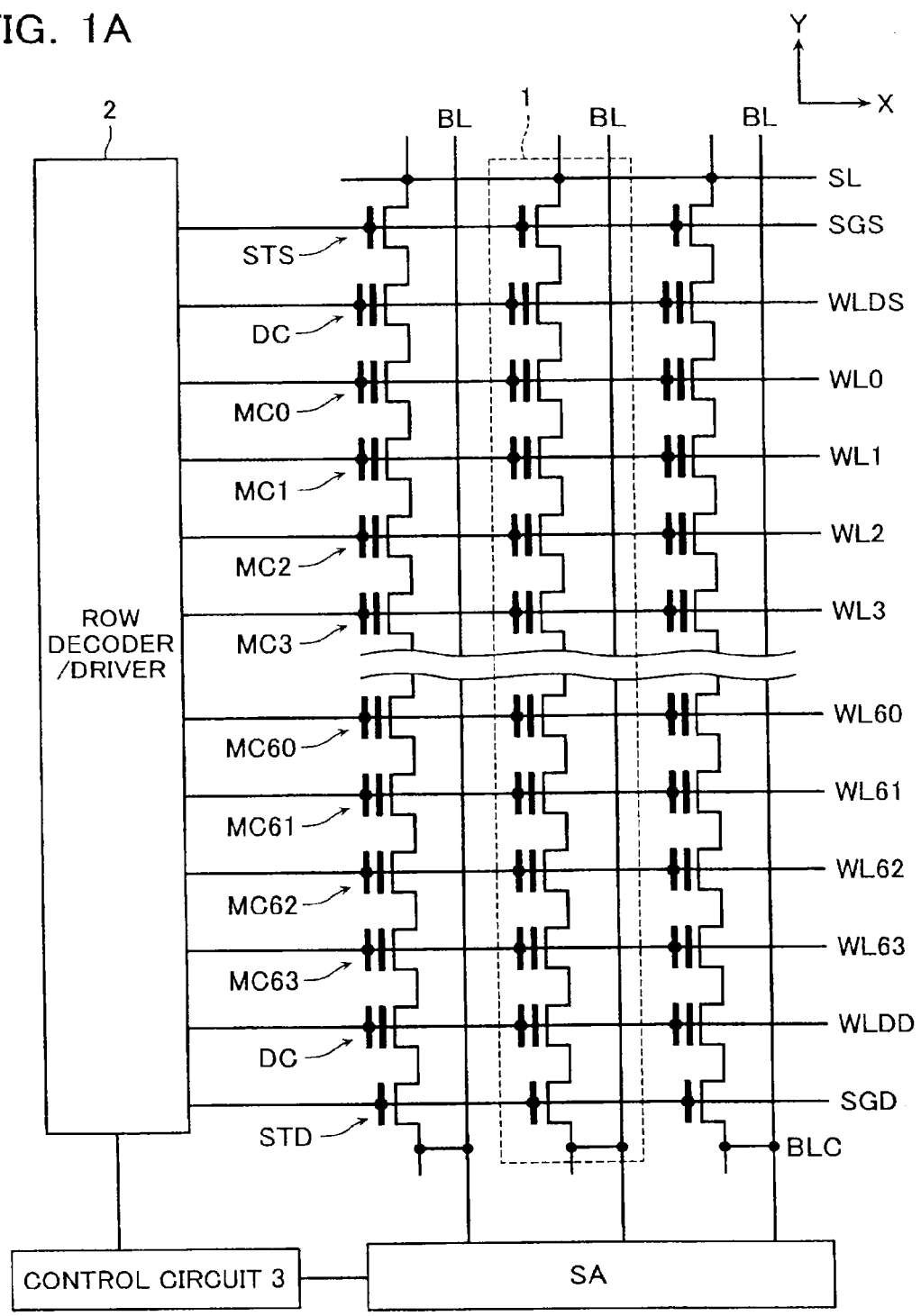
FIG. 1A is a diagram showing a memory cell array and a control circuit of a nonvolatile semiconductor memory device according to a first embodiment.

A nonvolatile semiconductor memory device according to one aspect of the present invention includes: a memory cell array configured as an arrangement of NAND cell units each including a memory string and select transistors connected to both ends of the memory string respectively, the memory string including a plurality of nonvolatile memory cells connected in series; word lines connected to control gate electrodes of the nonvolatile memory cells; bit lines connected to first ends of the NAND cell units; a source line connected to second ends of the NAND cell units; and a control circuit configured to simultaneously erase data stored in the nonvolatile memory cells arranged in a certain area, and then control a soft program operation of setting the nonvolatile memory cells in the certain area to a first threshold voltage distribution state of the nonvolatile memory cells. When a characteristic of the nonvolatile memory cells is determined as being in a first state, the control circuit executes the soft program operation by applying a first voltage for setting the nonvolatile memory cells to the first threshold voltage distribution state to first word lines of the word lines except a second word line connected to the nonvolatile memory cell at the end of the NAND cell unit, and applying a second voltage higher than the first voltage by a certain voltage value to the second word line. When the characteristic of the nonvolatile memory cells is determined as being in a second state, the control circuit executes the soft program operation by applying a third voltage equal to or lower than the first voltage to the first word lines and applying a fourth voltage lower than the second voltage by a certain voltage value to the second word line.

Next, the embodiments of the present invention will be explained in detail with reference to the drawings. In the attached drawings, any portions having the same configuration are denoted by the same reference numerals and redundant explanation thereof will be omitted in descriptions of the following embodiments. In the following embodiments, explanation will be given on the assumption that a nonvolatile semiconductor memory device is a NAND type flash memory that uses memory cells having a stacked gate structure. However, such a configuration is a mere example, and needless to say, the present invention is not limited to this.

First Embodiment

Configuration of Nonvolatile Semiconductor Memory Device According to First Embodiment The configuration of a nonvolatile semiconductor memory device according to the first embodiment of the present invention will be explained with reference to FIG. 1A.

FIG. 1A is a diagram showing a memory cell array and a control circuit of a NAND type flash memory according to the present embodiment. A NAND cell unit 1 of the NAND type flash memory includes a source-side select gate transistor STS and a drain-side select gate transistor STD, dummy cells DC connected to the select gate transistors STS and STD respectively, and a plurality of memory cells MCn (n=0 to 63) connected in series between the dummy cells DC. In the NAND cell unit 1, the plurality of memory cells MCn share their source and drain regions with adjoining memory cells and form a memory string. The memory cell array is configured with a plurality of NAND cell units 1 that are arranged in a matrix.

The memory cell MC includes N type source/drain regions that are formed in a P type well of a silicon substrate, and has a stacked gate structure including a control gate electrode and a floating gate electrode as a charge accumulation layer. The NAND type flash memory changes the amount of charge stored in the floating gate electrode by a writing operation and an erasing operation. Thereby, it changes the threshold voltage of the memory cell MC to store one-bit or multi-bit data in one memory cell. Here, if the memory cells MC0 and MC63 are directly connected to the select gate transistors STS and STD, there will occur dispersion in the operation characteristic between the memory cells M0 and M63 located at the ends of the NAND cell unit 1 and the remaining memory cells MC. Therefore, the dummy cells DC that are not used for normal data storage are provided at the ends of the NAND cell unit 1 to obtain uniform characteristic of the memory cells MC used for data storage.

Note that the memory cell array may be configured with no dummy cells DC provided at the ends of the NAND cell unit 1. In this case, the memory cells MC0 and MC 63 provided at the ends of the NAND cell unit 1 are also used for information storage. In the following embodiment, explanation will be given on the premise that the dummy cells DC are provided at the ends of the NAND cell unit 1. However, the NAND type flash memory according to the present invention is not limited to this. That is, the present invention can also be applied to a NAND type flash memory in which the memory cells MC at the ends of the NAND cell unit 1 are used not as dummy cells DC but as cells for data storage.

The control gate electrodes of a plurality of memory cells MCn arranged in the X direction of FIG. 1A are commonly connected by a word line WLn (n=0 to 63). The gate electrodes of a plurality of source-side select gate transistors STS are commonly connected by a source-side select gate line SGS. The gate electrodes of a plurality of drain-side select gate transistors STD are commonly connected by a drain-side select gate line SGD. The control gate electrodes of a plurality of dummy cells DC arranged in the X direction of FIG. 1A are commonly connected by a drain-side dummy word line WLDD or a source-side dummy word line WLDS. In the NAND type flash memory, an aggregate of a plurality of NAND cell units 1 that share word lines WLn form a block.

A bit line contact BLC is connected to the drain region of the drain-side select gate transistor STD. The bit line contact BLC is connected to a bit line BL extending in the Y direction of FIG. 1A. The source-side select gate transistor STS is connected via its source region to a source line SL extending in the X direction of FIG. 1A. Provided at one end of the bit lines BL is a sense amplifier circuit SA, which is used for operations of reading, writing, and erasing of cell data, as well as for operation of a soft program and a pre-program. Provided at one end of the word lines WL is a row decoder/driver 2, which selects and drives the word lines WL, the dummy word lines WLDS and WLDD, and the select gate lines SGS and SGD.

The NAND type flash memory is provided with a control circuit 3 that controls a reading operation, a writing operation, and an erasing operation to the memory cell array, and is used for a soft program operation and a pre-program operation to be described in detail later. The control circuit 3 determines based on various information whether the characteristic of the dummy cells DC and memory cells MC provided in the NAND cell unit 1 is in an initial state or a deteriorated state or to what degree the deteriorated state has advanced. For example, the control circuit 3 performs this determination based on the number of times a pulse has been applied in an erasing operation, the number of times a writing/erasing operation has been executed to the NAND type flash memory, the number of times a pulse has been applied in a writing operation, the number of times a pulse has been applied in a soft program operation, or the like. The control circuit 3 stores the number of times a writing/erasing operation has been executed to the NAND type flash memory and the number of times a pulse has been applied in a writing operation or a soft program operation based on operations of the sense amplifier circuit SA and row decoder/driver 2.

Figure 1B:
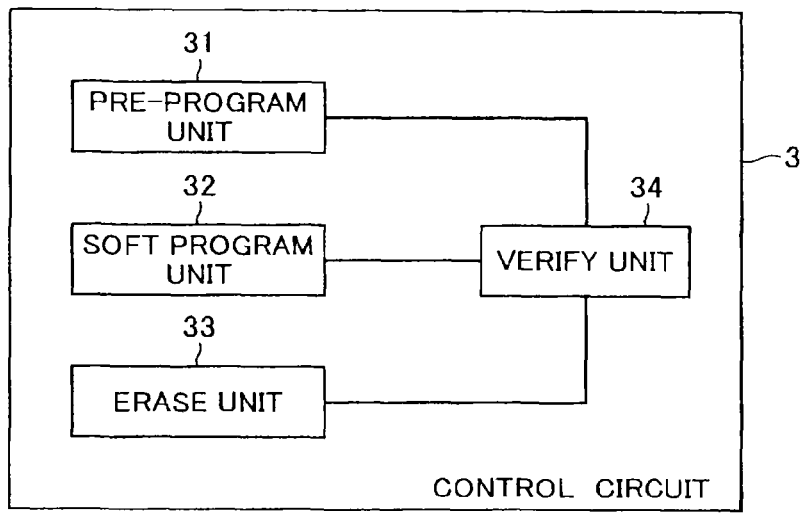
FIG. 1B is a block diagram showing a basic configuration of a control circuit of a nonvolatile semiconductor memory device according to an embodiment.

FIG. 1B is a block diagram showing a basic configuration of the control circuit 3. The control circuit 3 includes a pre-program unit 31, a soft program unit 32, an erasing unit 33, and a verify unit 34. The control circuit 3 controls a pre-program operation, a soft program operation, an erasing operation, and various verify operations to be described later.

Figure 2A:
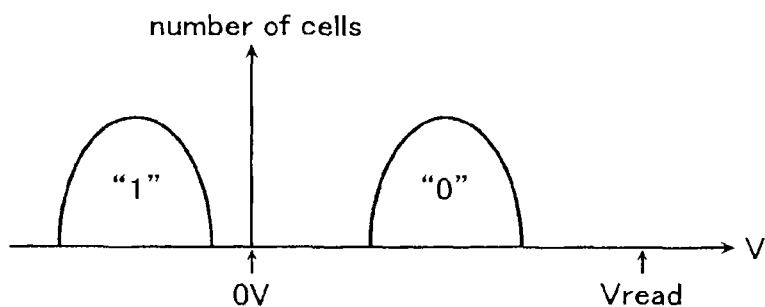
FIG. 2A is a diagram showing threshold voltage distributions of the nonvolatile semiconductor memory device according to the first embodiment.
Figure 2B:
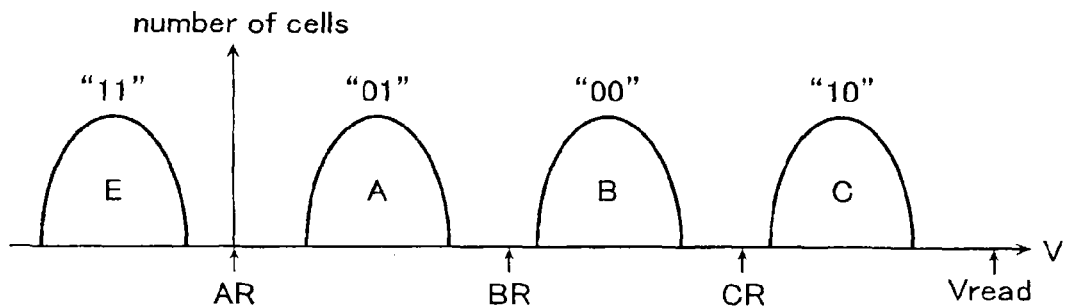
FIG. 2B is a diagram showing threshold voltage distributions of the nonvolatile semiconductor memory device according to the first embodiment.

Next, data storing states of the NAND type flash memory according to the present embodiment will be explained with reference to FIG. 2A and FIG. 2B. FIG. 2A and FIG. 2B are diagrams showing threshold voltage distributions of the memory cells MC of the NAND type flash memory according to the present embodiment.

When the memory cells MC of the NAND type flash memory store binary data (1 bit per cell), threshold voltage distributions of data are as shown in FIG. 2A. A state where the threshold voltage is negative represents data "1" (erased state), and a state where the threshold voltage is positive represents data "0". When the memory cells MC of the NAND type flash memory store four-value data (2 bits per cell), threshold voltage distributions of data are as shown in FIG. 2B. In this case, four types of threshold voltage distributions (E, A, B, and C) are set from a lower threshold voltage side. Four patterns of data "11", "01", "00", and "10" are assigned to these threshold voltage distributions respectively. Here, the threshold voltage distribution E is a negative threshold voltage state that is obtained by simultaneous block erasing.

In a data reading operation of the NAND type flash memory, a reading pass voltage Vread, which makes non-selected memory cells electrically conductive irrespective of the data stored therein, is applied to non-selected word lines WL in the memory cell array. Different reading pass voltages Vread may be applied to different non-selected memory cells. A reading pass voltage, which makes the dummy cells DC and the select gate transistors STS and STD electrically conductive, is applied to the dummy word lines WLDD and WLDS and the select gate lines SGS and SGD. Different reading pass voltages may be applied to the dummy cells DC and the select gate transistors STS and STD.

In an operation of reading binary data, a voltage between the two threshold voltage distributions (e.g., a voltage of 0V) is applied to a selected word line WL that is connected to a selected memory cell MC. Reading of data is executed by detecting whether or not a current flows through the NAND cell unit 1 in response to the application of the voltage. On the other hand, in an operation of reading four-value data, the voltage value of the voltage to be applied to a selected word line WL is set according to the four threshold voltage distributions of the selected memory cell MC. That is, it is set to a voltage AR, BR, or CR between the respective threshold voltage distributions. The voltage AR is the lowest voltage, and voltage values increase from BR to CR. In an operation of reading four-value data, reading of data is executed by detecting whether or not a current flows through the NAND cell unit 1 in accordance with which of the voltages AR, BR, and CR is applied.

In an operation of writing data "0", a writing voltage Vpgm (e.g., 15V to 20V) is applied to a selected word line WL. A voltage Vss is supplied to the bit line BL and transferred to the channel (hereinafter referred to as "cell channel") of the selected memory cell MC via the drain-side select gate transistor STD which is conductive. At this time, a high electrical field is applied between the floating gate electrode and cell channel of the selected memory cell MC to cause electrons to be injected into the floating gate electrode from the cell channel by the effect of FN tunneling. When multi-value data is stored, it is possible to set a plurality of threshold voltage distributions by adjusting the amount of electrons to be injected into the floating gate by varying the number of times of writing pulse application.

In an operation of writing data "1" (non-writing), a power supply voltage Vdd is supplied to the bit line BL and transferred to the cell channel of a selected memory cell MC via the drain-side select gate transistor STD which is conductive. After the cell channel is charged up to a voltage Vdd-Vth (where Vth is the threshold voltage of the select gate transistor), the select gate transistor becomes non-conductive and turns the cell channel into a floating state. In this case, even if a writing voltage Vpgm is applied to the selected word line WL, the potential of the cell channel will rise due to capacitance coupling with the selected word line WL, and electrons are not injected into the floating gate electrode. As a result, the memory cell MC will keep the data "1".

A data erasing operation of the NAND type flash memory is executed on a block basis. A data erasing operation is executed by setting all the word lines WL in a selected block including its dummy word lines WLDD and WLDS to 0V and applying a positive boosted erasing voltage (e.g., 18V to 20V) to the P-type well in which the memory cell array is formed. Consequently, all the memory cells MC in the selected block turn to a negative threshold voltage state (erased state) in which electrons in the floating gate electrodes are discharged. After this, an erasing verify operation is executed as needed. An erasing verify operation is executed as an operation of checking whether or not all the memory cells MC in the NAND cell unit 1 have been erased to a negative threshold voltage. Specifically, an erasing verify operation supplies a certain voltage (e.g., 0V) to all the word lines and detects whether or not a current flows through the NAND cell unit 1.

As described above, an erasing operation of the NAND type flash memory is executed simultaneously on all the memory cells in one block. Therefore, it is difficult to individually control the threshold voltage of each memory cell MC to an appropriate value. As a measure for this, the nonvolatile semiconductor memory device according to the present embodiment suppresses dispersion of the threshold voltages of the memory cells and the dummy cells by executing a soft program operation or a pre-program operation to be described later. As a result, threshold voltage state before a writing operation is set to an appropriate state, and the number of block defection is reduced.

In the following embodiment, controls of the soft program operation and the pre-program operation will be explained. First, in the first and second embodiments, a soft program operation and control thereof executed by the NAND type flash memory will be explained. After this, in the third embodiment, a pre-program operation of the NAND type flash memory will be explained.

[Soft Program Operation]

Figure 3:
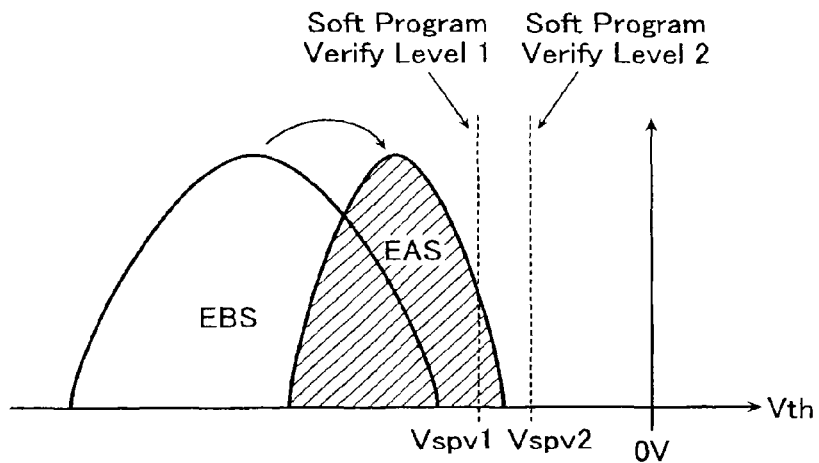
FIG. 3 is a diagram explaining a soft program operation of the nonvolatile semiconductor memory device according to the first embodiment.

Next, a soft program operation of the NAND type flash memory will be explained with reference to FIG. 3. In the erasing operation described above, normally, the lower limit of the threshold voltage distribution of the memory cells MC is not controlled. Therefore, the threshold voltage distribution of the memory cells MC after being erased is like a threshold voltage distribution EBS shown in the left-hand side of FIG. 3. In this case, the NAND cell unit 1 may possibly include memory cells MC that are in an over-erased state. In case memory cells MC have different threshold voltages, there may occur in a later operation a change of data (writing error) due to capacitance coupling between the floating gate electrodes of adjoining memory cells MC. Hence, a soft program operation that uses a weaker writing condition, i.e., a writing voltage Vspgm (e.g., 10V to 15V) that is lower than a normal writing voltage (e.g., 15V to 20V) is executed to all the memory cells MC and the dummy cells DC to eliminate the over-erased state. Accordingly, the threshold voltage distribution of the memory cells MC becomes like a threshold voltage distribution EAS shown in the right-hand side of FIG. 3. As a result of the soft program operation, the range of the threshold voltage distribution of the memory cells MC can be made narrower on the whole.

A soft program verify operation is executed after the soft program operation. This operation is executed as an operation of checking whether the threshold voltage of a certain number of memory cells MC or dummy cells DC has exceeded a soft program verify level 1 (voltage Vspv1). This operation determines a verify pass when the threshold voltage of a certain number of memory cells MC or dummy cells DC has exceeded the soft program verify level 1 (voltage Vspv1) shown in FIG. 3. If the threshold voltage of the memory cells MC or the dummy cells DC increased too much in the soft program operation, it would be impossible to distinguish between an erased state and a written state. Therefore, the soft program verify operation determines a verify fail when the threshold voltage of a certain number of memory cells MC or dummy cells DC has exceeded a soft program verify level 2 (voltage Vspv2).

Here, the following problem will arise if the same soft program voltage Vspgm is applied to all the word lines WL and the dummy word lines WLDD and WLDS in the soft program operation. Next, this problem will be explained with reference to FIG. 4A, FIG. 4B, FIG. 5A, FIG. 5B, and FIG. 5C.

Figure 4A:
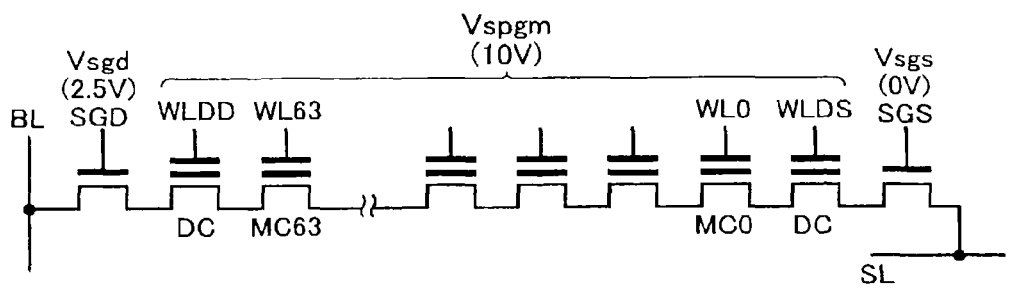
FIG. 4A is a diagram explaining a problem of a soft program operation of a nonvolatile semiconductor memory device.

First, with reference to FIG. 4A and FIG. 4B, a case will be explained in which the number of times a writing/erasing operation has been executed to the NAND type flash memory is small and hence the characteristic of the dummy cells DC and memory cells MC is in an initial state (first state). When the number of times a writing/erasing operation has been executed is small, neither the memory cells MC nor the dummy cells DC have deteriorated, and there is little difference in characteristic between them. Here, it is assumed that the same soft program voltage Vspgm (e.g., 10 v) is applied to all the word lines WL and the dummy word lines WLDD and WLDS in the soft program operation (see FIG. 4A). Further, a drain-side select gate voltage Vsgd (e.g., 2.5V) is applied to the drain-side select gate line SGD and a source-side select gate voltage Vsgs (e.g., 0V) is applied to the source-side select gate line SGS.

The select gate voltages Vsgd and Vsgs are lower than the soft program voltage Vspgm. The dummy cells DC adjoin the select gate transistors STD and STS, which are applied these select gate voltages Vsgd and Vsgs, respectively, to their gate electrodes. Therefore, in the soft program operation, the dummy cells DC are written more slowly than the normal memory cells MC, because each of the normal memory cells MC is sandwiched between the word lines WL applied with the soft program voltage Vspgm. As a result, after the soft program operation, the dummy cells DC and the normal memory cells MC have different threshold voltage values. That is, as shown by solid lines (After SPROG) in FIG. 4B, the threshold voltage of the dummy cells DC becomes lower than the threshold voltage of the normal memory cells MC.

Figure 4B:
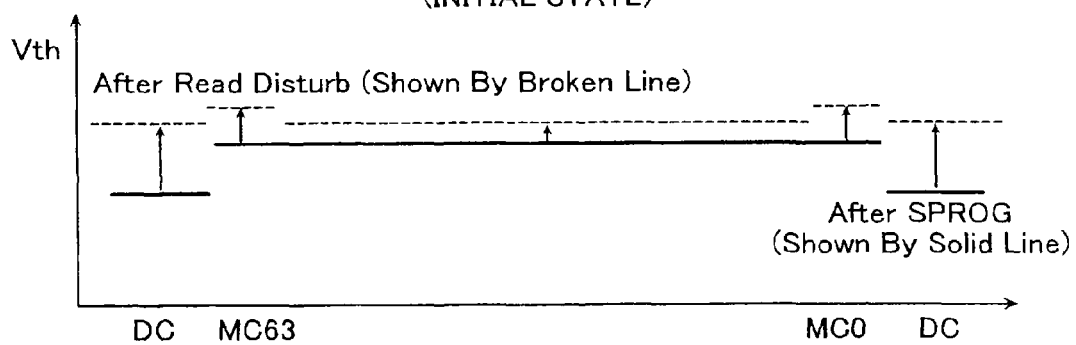
FIG. 4B is a diagram explaining a problem of a soft program operation of a nonvolatile semiconductor memory device.

If a reading operation is executed plural times in this state, the threshold voltages of the memory cells MC and dummy cells DC will increase due to a read disturb (see a broken line (After Read Disturb) in FIG. 4B). At this time, the dummy cells DC are more largely influenced by the read disturb because their threshold voltage is lower, and the amount of increase of the threshold voltage of the dummy cells DC is larger than the amount of increase of the threshold voltage of the normal memory cells MC. If the amount of increase of the threshold voltage of the dummy cells DC is larger when the read disturb occurs, an inter-cell interference occurs between the dummy cells DC and their adjoining memory cell MC0 or MC63 to increase the threshold voltage of the memory cells MC0 and MC63. As a result, there arises a problem that an unintentional change (writing error) occurs in the data of the memory cells MC0 and MC63.

Figure 5A:
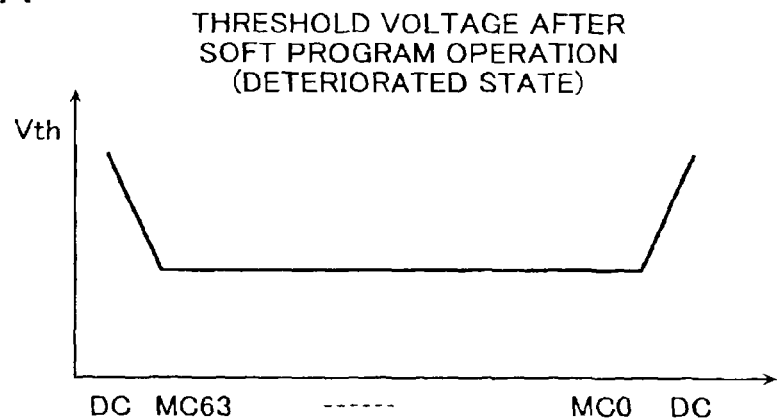
FIG. 5A is a diagram explaining a problem of a soft program operation of a nonvolatile semiconductor memory device.
Figure 5B:
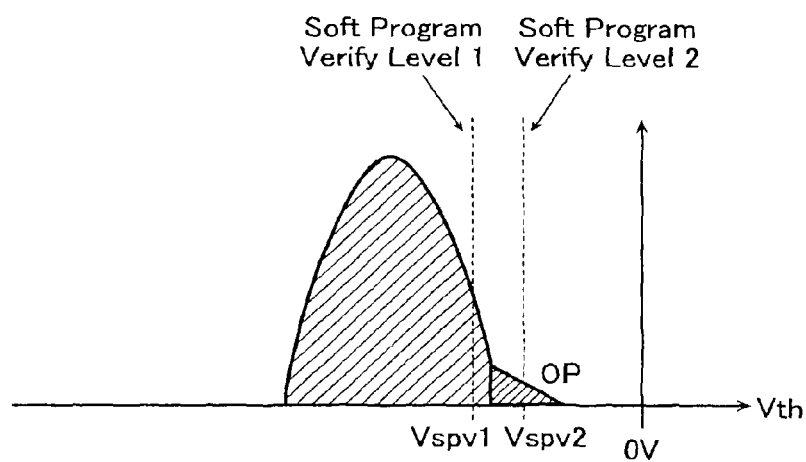
FIG. 5B is a diagram explaining a problem of a soft program operation of a nonvolatile semiconductor memory device.

Next, with reference to FIG. 5A, FIG. 5B, and FIG. 5C, a case will be explained in which a writing/erasing operation has been repeated to the NAND type flash memory plural times and hence the dummy cells DC and the memory cells MC are in a deteriorated state (second state). Through plural times of repetitive writing/erasing operations to the memory cells MC, the dummy cells DC in the vicinity of the ends of the NAND cell unit 1 have their tunnel insulating film deteriorated faster than the normal memory cells MC in the NAND cell unit 1 due to the influence of the select gate transistors STS and STD. It is assumed that the tunnel insulating film of the dummy cells DC is deteriorated. In case the same soft program operation would cause electrons to be injected into the floating gate electrode of the dummy cells DC and the normal memory cells MC, a writing speed of the dummy cells DC is faster than that of the normal memory cells MC.

Figure 5C:
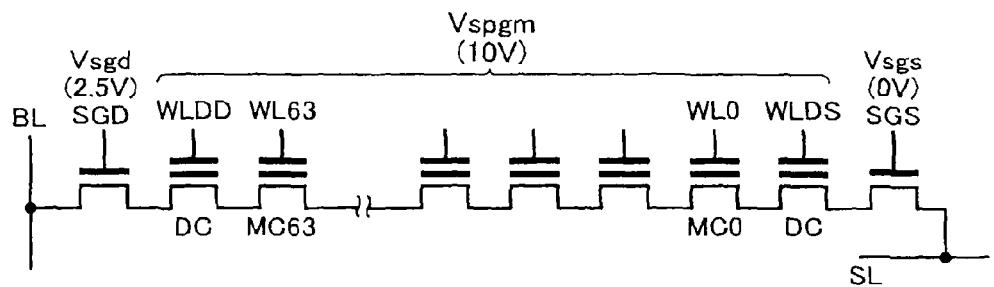
FIG. 5C is a diagram explaining a problem of a soft program operation of a nonvolatile semiconductor memory device.

Also in this soft program operation, it is assumed that the same soft program voltage Vspgm is applied to all the word lines WL and the dummy word lines WLDD and WLDS, as shown in FIG. 5C. When the dummy cells DC are deteriorated, they are written at a higher writing speed than the normal memory cells MC. Therefore, as shown in FIG. 5A, the threshold voltage of the dummy cells DC becomes higher than the threshold voltage of the normal memory cells MC. As a result, in the threshold voltage distribution after the soft program operation, some dummy cells DC are in an over-written state (OP: over-programmed state), as shown in FIG. 5B. If there are more than a certain number of dummy cells DC that are in the over-written state OP in which their threshold voltage exceeds the soft program verify level 2 (voltage Vspv2), the soft program operation cannot be completed normally. Therefore, there will arise a problem that a block that includes the NAND cell unit 1 in question may be determined as an error block. Furthermore, after a soft-program operation is executed, if the threshold voltages of the dummy cells are greatly different from the threshold voltages of the memory cells, it will become impossible to converge the threshold voltages of the dummy cells and the memory cells within a certain range in a writing operation to be executed later. As a result, a block that includes the dummy cells of which the threshold voltages are greatly different from the threshold voltages of the memory cells may be determined as an error block.

To solve these problems, the nonvolatile semiconductor memory device according to the present embodiment executes the following soft program operation.

[Operation of Nonvolatile Semiconductor Memory Device according to First Embodiment]

Figure 6A:
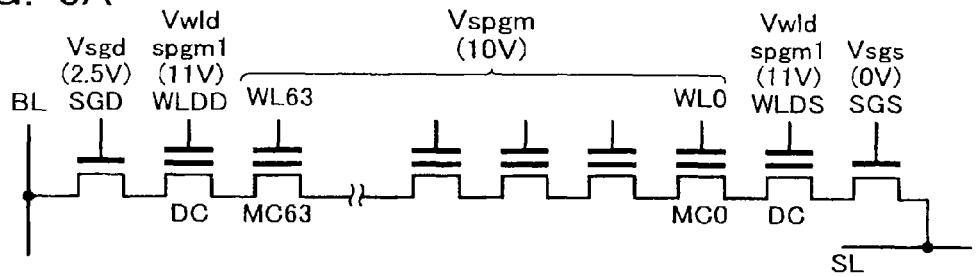
FIG. 6A is a diagram explaining the soft program operation of the nonvolatile semiconductor memory device according to the first embodiment.
Figure 6B:
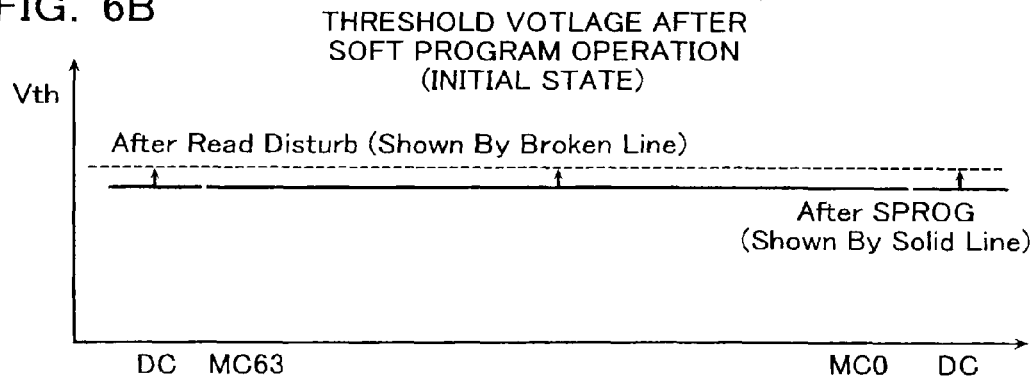
FIG. 6B is a diagram explaining the soft program operation of the nonvolatile semiconductor memory device according to the first embodiment.
Figure 7A:
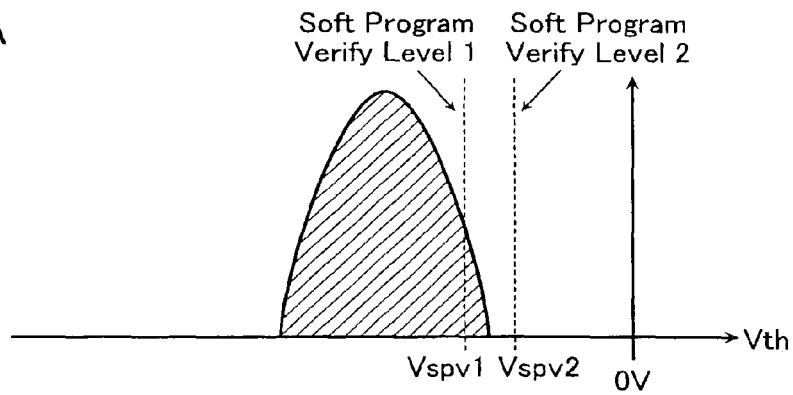
FIG. 7A is a diagram explaining the soft program operation of the nonvolatile semiconductor memory device according to the first embodiment.
Figure 7B:
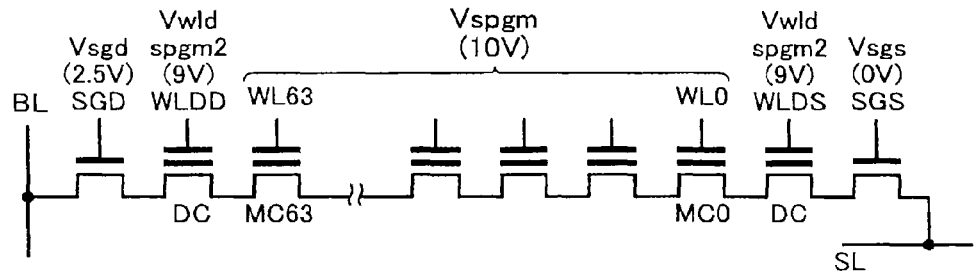
FIG. 7B is a diagram explaining the soft program operation of the nonvolatile semiconductor memory device according to the first embodiment.

FIG. 6A, FIG. 6B, FIG. 7A, and FIG. 7B are diagrams explaining the soft program operation of the NAND type flash memory according to the present embodiment. FIG. 6A and FIG. 6B show the soft program operation for a case where the number of times a writing/erasing operation has been executed to the NAND type flash memory is small and hence the characteristic of the dummy cells DC and memory cells MC is in the initial state. FIG. 7A and FIG. 7B show the soft program operation for a case where a writing/erasing operation has been repeated plural times to the NAND type flash memory and hence the dummy cells DC and the memory cells MC are in the deteriorated state.

First, the case where the number of times a writing/erasing operation has been executed to the NAND type flash memory is small and hence the characteristic of the dummy cells DC and memory cells MC is in the initial state will be explained with reference to FIG. 6A and FIG. 6B. The NAND type flash memory according to the present embodiment can determine whether the characteristic of the dummy cells DC and memory cells MC is in the initial state or the deteriorated state by means of the control circuit 3. The operation of the control circuit 3 will be described in detail later. When the control circuit 3 determines that the characteristic of the dummy cells DC and memory cells MC is in the initial state, the soft program voltage Vspgm is applied to the word lines WL connected to the normal memory cells MC as shown in FIG. 6A. The soft program voltage Vspgm is set to, for example, 10V. A dummy word line soft program voltage Vwld_spgm1 is applied to the dummy word lines WLDD and WLDS connected to the dummy cells DC. When the characteristic of the dummy cells DC and memory cells MC is in the initial state, the dummy word line soft program voltage Vwld_spgm1 is set to a voltage value (e.g., 11V) higher than the soft program voltage Vspgm (e.g., 10V) by a certain value. A drain-side select gate voltage Vsgd (e.g., 2.5V) is applied to the drain-side select gate line SGD, and a source-side select gate voltage Vsgs (e.g., 0V) is applied to the source-side select gate line SGS.

The voltage values presented above are mere examples in the soft program operation, and it is only necessary that the relationship in level between the voltage values of the voltages applied to the word lines WL and the dummy word lines WLDD and WLDS should be such that the voltage Vwld_spgm1 is higher than the voltage Vspgm. When the characteristic of the dummy cells DC and memory cells MC is in the initial state, the NAND type flash memory according to the present embodiment executes the soft program operation by applying the aforementioned voltage to the word lines WL. The soft program operation may be an operation of repeating applying the soft program voltages to the word lines WL and the dummy word lines WLDD and WLDS plural times.

Here, since the select gate voltages Vsgd and Vsgs are lower than the soft program voltage Vspgm, the speed at which the dummy cells DC adjoining the select gate transistors STD and STS are written may become slow. However, applied to the dummy word lines WLDD and WLDS is the dummy word line soft program voltage Vwld_spgm1, which is higher than the voltage Vspgm. Therefore, the speed at which the dummy cells DC are written becomes nearly equal to the speed at which the normal memory cells MC are written. As a result, there will not be dispersion between the threshold voltage value of the dummy cells DC and that of the normal memory cells MC after the soft program operation. That is, as shown by a solid line (After SPROG) in FIG. 6B, the threshold voltage of the dummy cells DC and that of the normal memory cells MC will be substantially the same value after the soft program operation.

Next, the case where a writing/erasing operation has been repeated plural times to the NAND type flash memory and hence the dummy cells DC and the memory cells MC are in the deteriorated state will be explained with reference to FIG. 7A and FIG. 7B. Also in this case where the control circuit 3 determines that the characteristic of the dummy cells DC and memory cells MC is in the deteriorated state, the same soft program voltage Vspgm (e.g., 10V) is applied to the word lines WL connected to the normal memory cells MC, as shown in FIG. 7B. Meanwhile, a dummy word line soft program voltage Vwld_spgm2 is applied to the dummy word lines WLDD and WLDS connected to the dummy cells DC. When the dummy cells DC are in the deteriorated state, the dummy word line soft program voltage Vwld_spgm2 is set to a voltage value (e.g., 9V) that is lower than the soft program voltage Vspgm by a certain value. A drain-side select gate voltage Vsgd (e.g., 2.5V) is applied to the drain-side select gate line SGD, and a source-side select gate voltage Vsgs (e.g., 0V) is applied to the source-side select gate line SGS.

The voltage values presented above are mere examples in the soft program operation, and it is only necessary that the relationship in level between the voltage values of the voltages applied to the word lines WL and the dummy word lines WLDD and WLDS should be such that the voltage Vwld_spgm2 is lower than the voltage Vspgm. When the characteristic of the dummy cells DC and memory cells MC is in the deteriorated state, the NAND type flash memory according to the present embodiment executes the soft program operation by applying the aforementioned voltage Vspgm to the word lines WL. The soft program operation may be an operation of repeating applying the soft program voltages to the word lines WL and the dummy word lines WLDD and WLDS plural times.

Figure 8A:
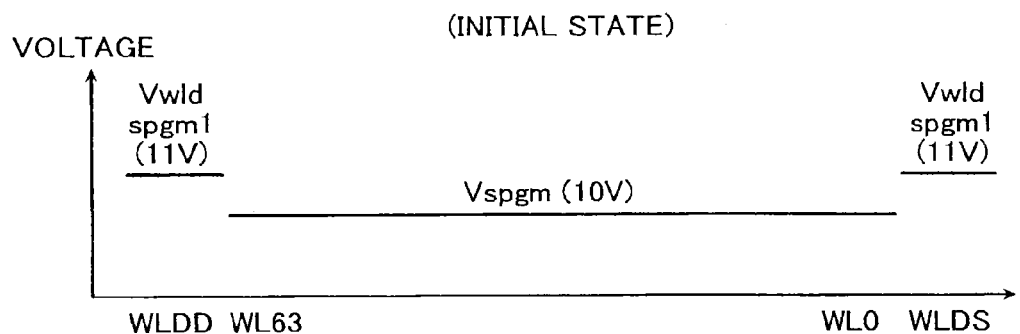
FIG. 8A is a diagram explaining the soft program operation of the nonvolatile semiconductor memory device according to the first embodiment.
Figure 8B:
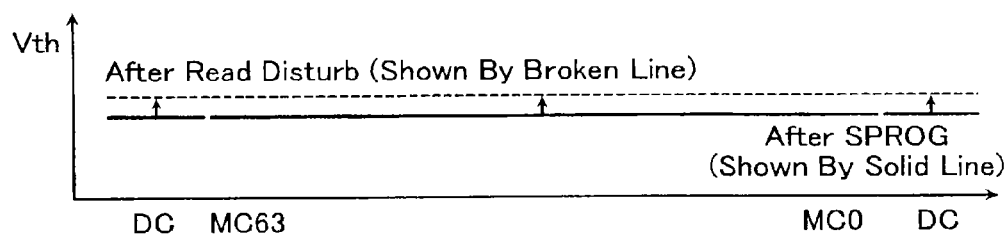
FIG. 8B is a diagram explaining the soft program operation of the nonvolatile semiconductor memory device according to the first embodiment.

The embodiment described above has explained the states of the dummy cells DC as including two states, namely the initial state and the deteriorated state. The states may be divided into three or more plurality of states according to the degree of advancement of deterioration. A case where the states of the dummy cells DC include a plurality of states will be explained with reference to FIG. 8A, FIG. 8B, FIG. 8C, FIG. 9A, and FIG. 9B. FIG. 8A and FIG. 8B show a case where the characteristic of the dummy cells DC is in the initial state. FIG. 8A is a diagram showing the voltages to be applied to the word lines WL and the dummy word lines WLDD and WLDS in the soft program operation. FIG. 8B is a diagram showing the value of the threshold voltage of the memory cells after the soft program operation. FIG. 9A and FIG. 9B show a case where the characteristic of the dummy cells DC is in the deteriorated state. FIG. 9A is a diagram showing the voltages to be applied to the word lines WL and the dummy word lines WLDD and WLDS in the soft program operation. FIG. 9B is a diagram showing the value of the threshold voltage of the memory cells after the soft program operation.

Figure 8C:
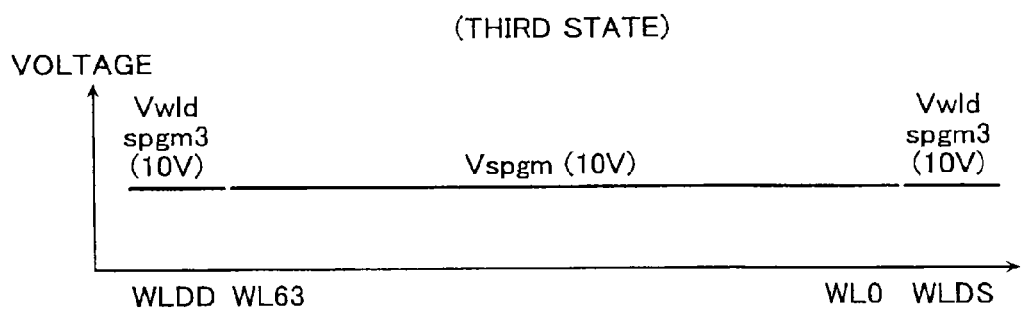
FIG. 8C is a diagram explaining the soft program operation of the nonvolatile semiconductor memory device according to the first embodiment.
Figure 9A:
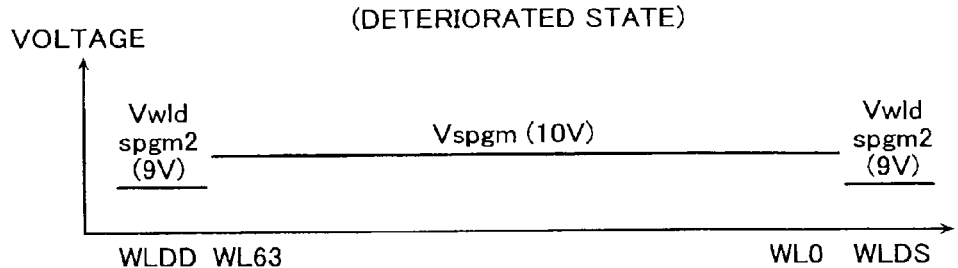
FIG. 9A is a diagram explaining the soft program operation of the nonvolatile semiconductor memory device according to the first embodiment.
Figure 9B:
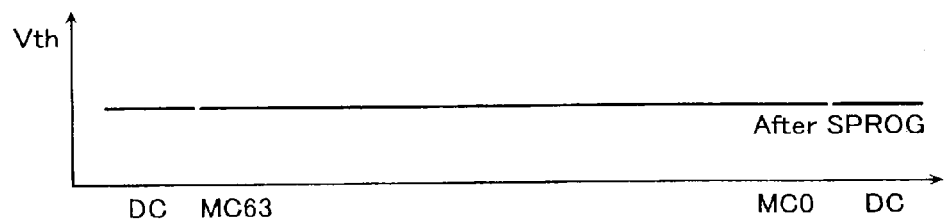
FIG. 9B is a diagram explaining the soft program operation of the nonvolatile semiconductor memory device according to the first embodiment.

The state shown in FIG. 8C represents a case where a writing/erasing operation to the NAND type flash memory has been repeated plural times and hence the dummy cells DC are in a slightly deteriorated state (third state). The state that the dummy cells DC are slightly deteriorated (or the third state) means an intermediate state that will appear when the dummy cells DC shift from the initial state to the deteriorated state. In the slightly deteriorated state (third state) of the dummy cells DC, the relationship in level between the voltage values of the voltages to be applied to the word lines WL and the dummy word lines WLDD and WLDS can be set such that the voltage Vwld_spgm is equal to the voltage Vspgm. In this case, the voltage to be applied to the dummy word lines WLDD and WLDS is referred to as voltage Vwld_spgm3.

The voltage to be applied to the dummy word lines WLDD and WLDS in the soft program operation changes from the voltage Vwld_spgm1 to the voltage Vwld_spgm3 and to the voltage Vwld_spgm2 as deterioration of the dummy cells DC advances (FIG. 8A, FIG. 8C, FIG. 9A). Based on the advancement of deterioration of the dummy cells DC and memory cells MC, the relationships between the voltage Vspgm applied to the word lines WL and the voltage applied to the dummy word lines WLDD and WLDS in the soft program operation are as follows.

Voltage Vwld_spgm1>Voltage Vspgm
Voltage Vwld_spgm3=Voltage Vspgm
Voltage Vwld_spgm2<Voltage Vspgm In other words, the voltage applied to the dummy word line WLDD in the soft program operation changes in a way of Voltage Vwld_spgm1>Voltage Vwld_spgm3>Voltage Vwld_spgm2 as a writing/erasing operation to the NAND type flash memory is repeated more times.

As described above, the dummy cells DC which are deteriorated by repetition of writing/erasing operations to the NAND type flash memory will be written at a higher speed than that of the normal memory cells MC. However, in the soft program operation according to the present embodiment, in the deteriorated state of the dummy cells DC, the dummy word line soft program voltage Vwld_spgm2 is set to a voltage lower than the soft program voltage Vspgm as shown in FIG. 7B. Further, in the slightly deteriorated state of the dummy cells DC, the dummy word line soft program voltage Vwld_spgm3 is set to a voltage nearly equal to the soft program voltage Vspgm as shown in FIG. 8C. Therefore, the speed at which the dummy cells DC are written is nearly equal to the speed at which the normal memory cells MC are written. As a result, the dummy cells Dc and the normal memory cells MC will not have different threshold voltage values after the soft program operation. As shown in FIG. 7A, the threshold voltage distribution after the soft program operation will include no cells that are in an over-written state (OP: over-programmed state).

[Effect of Nonvolatile Semiconductor Memory Device According to First Embodiment]

An effect of the soft program operation of the NAND type flash memory according to the present embodiment will be explained with reference to FIG. 8A to FIG. 9B.

In the NAND type flash memory according to the present embodiment, different voltages are applied to the word lines WL and the dummy word lines WLDS and WLDD in the soft program operation, as shown in FIG. 8A and FIG. 9A. That is, the soft program voltage Vspgm is applied to the word lines WL and the dummy word line soft program voltages Vwld_spgm1 and Vwld_spgm2 are applied to the dummy word lines WLDS and WLDD. Further, the relationship in voltage level between the soft program voltage Vspgm and the dummy word line soft program voltage Vwld_spgm1 or Vwld_spgm2 is changed depending on whether the characteristic of the dummy cells DC and memory cells MC is in the initial state or the dummy cells DC are in the deteriorated state. As a result, the NAND type flash memory according to the present embodiment can suppress dispersion in threshold voltage between the memory cells MC and the dummy cells DC after the soft program operation, as shown in FIG. 8B and FIG. 9B.

When the characteristic of the dummy cells DC and memory cells MC is in the initial state, the threshold voltage of the dummy cells DC and that of the normal memory cells MC will be substantially equal after the soft program operation, as shown in FIG. 8B. When a reading operation is executed in this state, the threshold voltage of the memory cells MC and dummy cells DC will increase due to a read disturb (see a broken line (After Read Disturb) in FIG. 8B). Here, the amount of increase of the threshold voltage of the dummy cells DC due to the read disturb is substantially equal to the amount of increase of the threshold voltage of the normal memory cells MC because the threshold voltage of the dummy cells DC is substantially equal to that of the normal memory cells MC. Therefore, when a read disturb occurs, the influence given on the memory cells MC0 and MC63 adjoining the dummy cells DC will be less, making it possible to prevent writing error in the memory cells MO and M63.

Also when the dummy cells DC and the memory cells MC are in the deteriorated state, the threshold voltage of the dummy cells DC and that of the normal memory cells MC will be substantially equal after the soft program operation, as shown in FIG. 9B. That is, in the threshold voltage distribution after the soft program operation, there are not cells in an over-written state (OP: over-programmed state) (see the threshold voltage distribution of FIG. 7A). As a result, the number of dummy cells DC and memory cells MC that are in the over-written state OP with a threshold voltage exceeding the soft program verify level 2 (voltage Vspv2) will not exceed the certain number, enabling the soft program operation to be completed normally. In this way, the NAND type flash memory according to the present embodiment can securely execute the soft program operation.

When the dummy cells DC and the memory cells MC are in the deteriorated state, it is also conceivable to set the dummy word line soft program voltage Vwld_spgm2 equal to the soft program voltage Vspgm and apply the dummy word line soft program voltage Vwld_spgm2 to the dummy word lines a smaller number of times than the soft program voltage Vspgm is applied to the word lines. However, this scheme cannot manage a case where the threshold of the dummy cells DC will exceed the soft program verify level 2 (voltage Vspv2) when the dummy word line soft program voltage Vwld_spgm2 (=Vspgm) is applied to the dummy word lines only once.

Second Embodiment

Configuration of Nonvolatile Semiconductor Memory Device According to Second Embodiment Next, a nonvolatile semiconductor memory device according to the second embodiment of the present invention will be explained. The configuration of the nonvolatile semiconductor memory device according to the second embodiment is substantially the same as the first embodiment, and will not therefore be explained repeatedly. The nonvolatile semiconductor memory device according to the second embodiment is different from the first embodiment in that the voltage value of the soft program voltage Vspgm applied to the word lines WL is changed.

[Operation of Nonvolatile Semiconductor Memory Device According to Second Embodiment]

Figure 10A:
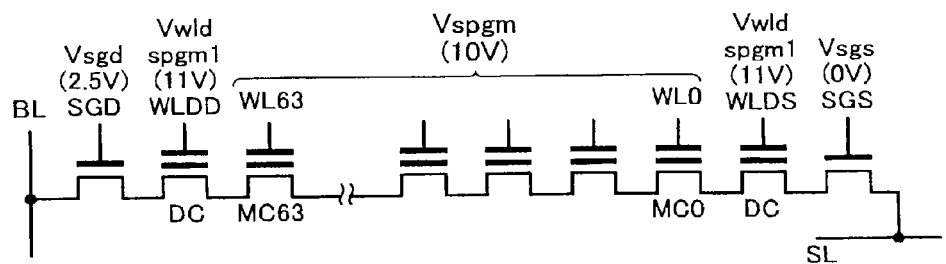
FIG. 10A is a diagram explaining a soft program operation of a nonvolatile semiconductor memory device according to a second embodiment.
Figure 10B:
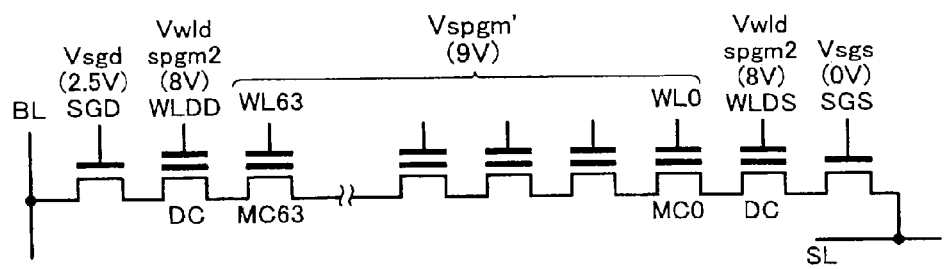
FIG. 10B is a diagram explaining the soft program operation of the nonvolatile semiconductor memory device according to the second embodiment.

FIG. 10A and FIG. 10B are diagrams explaining a soft program operation of a NAND type flash memory according to the present embodiment. FIG. 10A shows a state of voltage application to the word lines WL and the dummy word lines WLDD and WLDS in the soft program operation when the characteristic of the dummy cells DC and memory cells MC is in an initial state. FIG. 10B shows a state of voltage application to the word lines WL and the dummy word lines WLDD and WLDS in the soft program operation when the dummy cells DC and the memory cells MC are in a deteriorated state. In the soft program operation according to the present embodiment, the voltage value of the soft program voltage Vspgm to be applied to the word lines WL is changed according to whether the characteristic of the dummy cells DC and memory cells MC is in the initial state or in the deteriorated state.

First, with reference to FIG. 10A, the case that the number of times a writing/erasing operation has been executed to the NAND type flash memory is small and hence the characteristic of the dummy cells DC and memory cells MC is in the initial state will be explained. When the control circuit 3 determines that the characteristic of the dummy cells DC and memory cells MC is in the initial state, a soft program voltage Vspgm is applied to the word lines WL connected to the normal memory cells MC, as shown in FIG. 10A. This soft program voltage Vspgm is set to, for example, 10V. A dummy word line soft program voltage Vwld_spgm1 is applied to the dummy word lines WLDD and WLDS connected to the dummy cells DC. When the characteristic of the dummy cells DC and memory cells MC is in the initial state, this dummy word line soft program voltage Vwld_spgm1 is set to a voltage value (e.g., 11V) higher than the soft program voltage Vspgm by a certain value. A drain-side select gate voltage Vsgd (e.g., 2.5V) is applied to the drain-side select gate line SGD, and a source-side select gate voltage Vsgs (e.g., 0V) is applied to the source-side select gate line SGS.

The voltage values presented above are mere examples in the soft program operation, and it is only necessary that the relationship in voltage level between the voltages applied to the word lines WL and the dummy word lines WLDD or WLDS should be such that the voltage Vwld_spgm1 is higher than the voltage Vspgm. When the characteristic of the dummy cells DC and memory cells MC is in the initial state, the NAND type flash memory according to the present embodiment executes the soft program operation by applying the aforementioned voltage to the word lines WL.

Next, with reference to FIG. 10B, the case that a writing/erasing operation to the NAND type flash memory has been repeated plural times and hence the dummy cells DC and the memory cells MC have deteriorated will be explained. When the control circuit 3 determines that the characteristic of the dummy cells DC and memory cells MC is in the deteriorated state, a soft program voltage Vspgm' is applied to the word lines WL connected to the normal memory cells MC, as shown in FIG. 10B. In the soft program operation according to the present embodiment, the voltage value of the soft program voltage to be applied to the word lines WL is changed according to whether the dummy cells DC and the memory cells MC are in the initial state or in the deteriorated state. That is, when the characteristic of the dummy cells DC and memory cells MC is in the deteriorated state, the voltage value of the soft program voltage Vspgm' is set to a voltage value (e.g., 9V) lower than the soft program voltage Vspgm in the initial state by a certain value.

A dummy word line soft program voltage Vwld_spgm2 is applied to the dummy word lines WLDD and WLDS connected to the dummy cells DC. When the dummy cells DC and the memory cells MC are in the deteriorated state, this dummy word line soft program voltage Vwld_spgm2 is set to a voltage value (e.g., 8V) lower than the soft program voltage Vspgm' by a certain value. A drain-side select gate voltage Vsgd (e.g., 2.5V) is applied to the drain-side select gate line SGD, and a source-side select gate voltage Vsgs (e.g., 0V) is applied to the source-side select gate line SGS.

The voltage values presented above are mere examples in the soft program operation, and it is only necessary that the relationship in voltage level between the voltages to be applied to the word lines WL and the dummy word lines WLDD or WLDS should be such that the voltage Vwld_spgm2 is lower than the voltage Vspgm'. When the characteristic of the dummy cells DC and memory cells MC is in the deteriorated state, the NAND type flash memory according to the present embodiment executes the soft program operation by applying the aforementioned voltage to the word lines WL. The voltage Vwld_spgm2 is lower than the voltage Vwld_spgm1, and the voltage Vspgm' is lower than the voltage Vspgm.

[Effect of Nonvolatile Semiconductor Memory Device According to Second Embodiment]

Also the NAND type flash memory according to the present embodiment applies different voltages to the word lines WL and the dummy word lines WLDS and WLDD in the soft program operation. Furthermore, the relationship in voltage level between the soft program voltage Vspgm and the dummy word line soft program voltages Vwld_spgm1 or Vwld_spgm2 is changed depending on whether the characteristic of the dummy cells DC and memory cells MC is in the initial state or the dummy cells DC and the memory cells MC are in the deteriorated state. As a result, also the NAND type flash memory according to the present embodiment can suppress dispersion between the threshold voltage of the memory cells MC and that of the dummy cells DC after the soft program operation.

When writing/erasing operations of the NAND type flash memory are repeated plural times, not only the dummy cells DC but also the normal memory cells MC may deteriorate. Specifically, also the memory cells MC have their tunnel insulating film deteriorated through repetition of writing/erasing operations, and a writing speed of the normal memory cells MC is faster. If the voltage value of the soft program voltage Vspgm remains the same regardless of whether the characteristic of the memory cells MC is in the initial state or in the deteriorated state, some of the memory cells MC might become an over-written state (OP: over-programmed state) in the soft program operation. If the number of memory cells MC that are in the over-written state OP with a threshold voltage exceeding the soft program verify level 2 (voltage Vspv2) exceeds a certain number, the soft program operation cannot be completed normally.

However, in the NAND type flash memory according to the present embodiment, the soft program voltage Vspgm' applied to the word lines is set to a voltage lower than the soft program voltage Vspgm, as shown in FIG. 10A and FIG. 10B. Accordingly, the speed at which the memory cells MC in the deteriorated state are written can be slowed down and there will not occur cells that will be in the over-written state (OP: over-programmed state). As a result, the number of dummy cells DC and memory cells MC in the over-written state OP with a threshold voltage exceeding the soft program verify level 2 (voltage Vspv2) will not exceed the certain number, enabling the soft program operation to be completed normally. In this way, the NAND type flash memory according to the present embodiment can securely execute the soft program operation.

Similarly to the first embodiment, there may exist a state (third state) in which the dummy cells DC are slightly deteriorated due to plural times of repetitive writing/erasing operations of the NAND type flash memory. Also in this case, the dummy word line soft program voltage changes in a way of Voltage Vwld_spgm1>Voltage Vwld_spgm3>Voltage Vwld_spgm2, as in the first embodiment.

The NAND type flash memory according to the embodiments of the present invention has been explained. This NAND type flash memory changes the relationship in voltage level between the soft program voltage Vspgm applied to the word lines and the dummy word line soft program voltage Vwld_spgm1 or Vwld_spgm2 according to whether the characteristic of the dummy cells DC and memory cells MC is in the initial state or in the deteriorated state. The determination of whether the characteristic of the dummy cells DC and memory cells MC is in the initial state or in the deteriorated state is performed by the control circuit 3. In the following description, the operation of the control circuit 3 for determining the characteristic of the dummy cells DC and memory cells MC will be explained. The determination operation of the control circuit 3 to be explained below can be applied to both of the first and second embodiments.

[Determination Operation 1 by Control Circuit 3]

Figure 11:
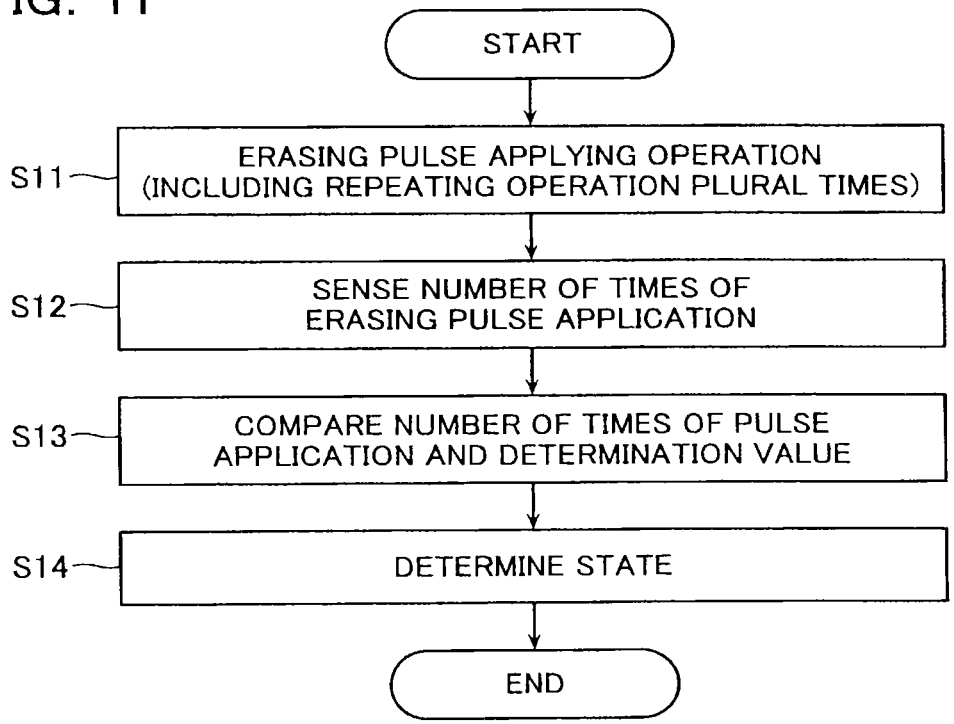
FIG. 11 is a flowchart explaining an operation of a control circuit according to an embodiment.

FIG. 11 is a flowchart explaining the operation of the control circuit 3 in the soft program operation of the NAND type flash memory according to the present embodiment.

The soft program operation of the NAND type flash memory according to the first and second embodiments is executed subsequently to an erasing operation. In erasing data, as described above, the control gate voltage of the memory cells MC is set to 0V, and an erasing pulse having a high voltage is supplied to the well in which the memory cells MC are disposed. This causes electrons to be discharged from the floating gate electrode to the semiconductor substrate via the tunnel insulating film, and causes the threshold voltage of the memory cells MC to shift to the negative direction. Application of the erasing pulse is carried out plural times by incrementing its voltage value. The control circuit 3 can determine the characteristic of the dummy cells DC and memory cells MC based on the number of times the erasing pulse has been applied. This will be explained below with reference to FIG. 11.

In an erasing operation of the NAND type flash memory, the erasing pulse voltage to be applied to the well is applied plural times by incrementing the voltage value by a certain voltage value (step S11). After this, a verify operation for checking whether erasing has been completed is executed to confirm that the erasing operation has been completed. At this time, the control circuit 3 senses how many times the erasing pulse has been applied (step S12). The control circuit 3 compares the number of times the erasing pulse has been applied in the erasing operation with a preset determination value (step S13).

Each time an operation is executed on the NAND type flash memory, the tunnel insulating film of the dummy cells DC and the memory cells MC deteriorates. As the tunnel insulating film of the dummy cells DC and memory cells MC becomes more deteriorated, the speed of an erasing operation of discharging electrons from the floating gate electrode becomes slower. Therefore, as the dummy cells DC and the memory cells MC become more deteriorated, the number of times of applying a pulse becomes larger at an erasing operation. The control circuit 3 compares this number of times the erasing pulse has been applied in the erasing operation with the determination value.

The control circuit 3 determines the state of the dummy cells DC and memory cells MC based on the number of times the erasing pulse has been applied in the erasing operation and the determination value (step S14). For example, when the number of times the erasing pulse has been applied in the erasing operation exceeds the certain value, the control circuit 3 determines that the dummy cells DC and the memory cells MC are in the deteriorated state. On the other hand, when the number of times the erasing pulse has been applied in the erasing operation is equal to or smaller than the certain value, the control circuit 3 determines that the dummy cells DC and the memory cells MC are in the initial state. The control circuit 3 may have a plurality of determination values and distinguish among a plurality of states such as an initial state, a slightly deteriorated state, a deteriorated state, etc. based on the comparison with these determination values.

The sense amplifier circuit SA and the row decoder/driver 2 execute the voltage applying method according to the above-described embodiments based on the determination result of the control circuit 3. In the determination operation based on the number of times a reset pulse has been applied, because the number of times the erasing pulse has been applied is directly sensed in the erasing operation, the control circuit 3 needs not store the number of times the erasing pulse has been applied. In this case, there is no need of securing an information storage area in the control circuit 3, and the NAND type flash memory can therefore be disposed in a simpler configuration.

[Determination Operation 2 by Control Circuit 3]

Figure 12:
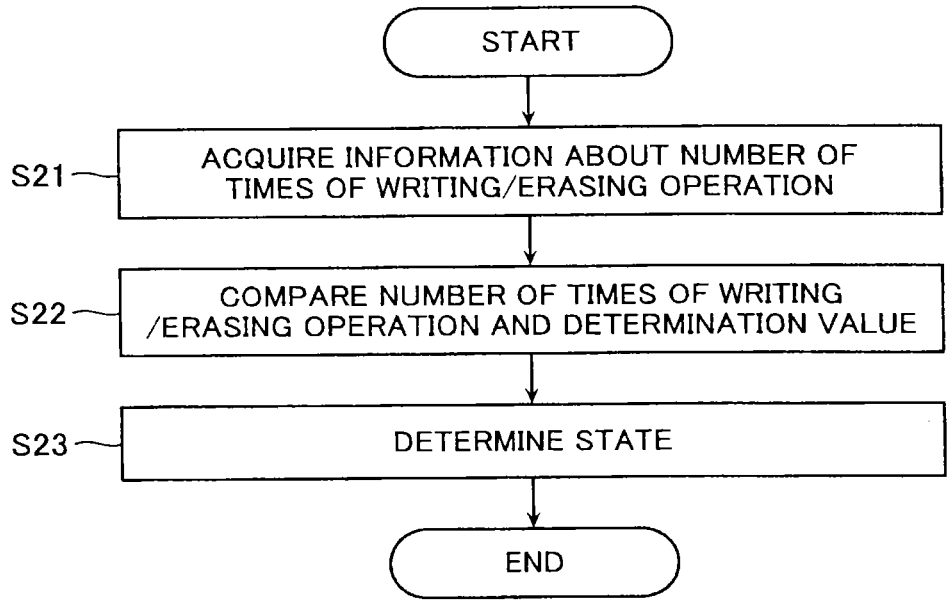
FIG. 12 is a flowchart explaining an operation of a control circuit according to an embodiment.

FIG. 12 is a flowchart explaining the operation of the control circuit 3 in the soft program operation of the NAND type flash memory according to the present embodiment. FIG. 12 shows a case that the control circuit 3 executes the determination operation based on the number of times a writing/erasing operation has been executed on the NAND type flash memory.

In this case, each time a writing/erasing operation is executed on the NAND type flash memory, information indicating that a writing/erasing operation has been executed is sent by the sense amplifier circuit SA and the row decoder/driver 2 into the control circuit 3. The control circuit 3 stores the number of times a writing/erasing operation has been executed on the NAND type flash memory based on this information. The control circuit 3 can determine the characteristic of the dummy cells DC and memory cells MC based on the number of times a writing/erasing operation has been executed on the NAND type flash memory. This will be explained below with reference to FIG. 12.

When the determination operation by the control circuit 3 is started, the control circuit 3 acquires the information about the number of times a writing/erasing operation has been executed on the NAND type flash memory from the storage area inside the control circuit 3 (step S21). The information about the number of times a writing/erasing operation has been executed indicates how many times a writing/erasing operation has been executed in the past on the block to which the soft program operation is to be executed. The control circuit 3 compares the number of times a writing/erasing operation has been executed on the NAND type flash memory with a preset determination value (step S22).

As described above, each time a writing/erasing operation is executed on the NAND type flash memory, the tunnel insulating film of the dummy cells DC and memory cells MC deteriorates. The control circuit 3 determines the state of the dummy cells DC and memory cells MC based on the number of times a writing/erasing operation has been executed on the NAND type flash memory and the determination value (step S23).

For example, when the number of times a writing/erasing operation has been executed on the NAND type flash memory exceeds the certain value, the control circuit 3 determines that the dummy cells DC and the memory cells MC are in the deteriorated state. On the other hand, when the number of times a writing/erasing operation has been executed on the NAND type flash memory is equal to or smaller than the certain value, the control circuit 3 determines that the dummy cells DC and the memory cells MC are in the initial state. The control circuit 3 may have a plurality of determination values and distinguish among a plurality of states such as an initial state, a slightly deteriorated state, a deteriorated state, etc. based on comparison with these determination values. The sense amplifier circuit SA and the row decoder/driver 2 execute the voltage applying method according to the above-described embodiments based on the determination result of the control circuit 3.

[Determination Operation 3 by Control Circuit 3]

Figure 13:
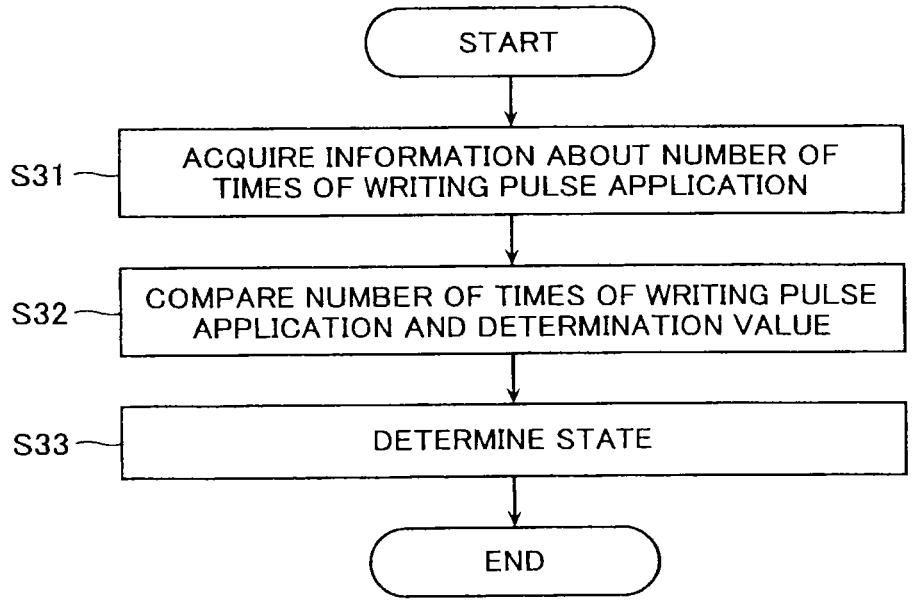
FIG. 13 is a flowchart explaining an operation of a control circuit according to an embodiment.

FIG. 13 is a flowchart explaining the operation of the control circuit 3 in the soft program operation of the NAND type flash memory according to the present embodiment. FIG. 13 shows a case that the control circuit 3 executes the determination operation based on the number of times a pulse has been applied in a writing operation on the NAND type flash memory.

In a data writing operation, a writing voltage (e.g., 15V to 20V) is applied to the selected word line WL. A voltage Vss is applied to the channel of the selected memory cell MC. This causes a high electrical field to be applied between the floating gate electrode and cell channel of the selected memory cell MC and electrons to be injected into the floating gate electrode from the cell channel. This writing pulse is applied plural times by incrementing the voltage value thereof. In the writing operation, information indicating how many times the writing pulse has been applied is sent by the sense amplifier circuit SA and the row decoder/driver 2 to the control circuit 3. The control circuit 3 stores the number of times the pulse has been applied in the writing operation based on this information. The control circuit 3 can determine the characteristic of the dummy cells DC and memory cells MC based on the number of times the pulse has been applied in the writing operation. This will be explained below with reference to FIG. 13.

When the determination operation by the control circuit 3 is started, the control circuit 3 acquires the information about the number of times a pulse has been applied in a writing operation from the storage area inside the control circuit 3 (step S31). The information about the number of times a pulse has been applied in a writing operation indicates the number of times a pulse has been applied in the last writing operation on the block to which the soft program operation is to be executed. The control circuit 3 compares the number of times a pulse has been applied in the writing operation with a preset determination value (step S32).

As described above, as the tunnel insulating film of the dummy cells DC and memory cells MC becomes more deteriorated, the speed of a writing operation of injecting electrons into the floating gate electrode becomes faster. Therefore, as the dummy cells DC and the memory cells MC become more deteriorated, the number of times of applying a pulse becomes smaller at a writing operation. The control circuit 3 determines the state of the dummy cells DC and memory cells MC based on this number of times a pulse has been applied in the writing operation and the determination value (step S33).

For example, when the number of times a pulse has been applied in the writing operation is smaller than a certain value, the control circuit 3 determines that the dummy cells DC and the memory cells MC are in the deteriorated state. On the other hand, when the number of times a pulse has been applied in the writing operation is equal to or larger than the certain value, the control circuit 3 determines that the dummy cells DC and the memory cells MC are in the initial state. The control circuit 3 may have a plurality of determination values and distinguish among a plurality of states such as an initial state, a slightly deteriorated state, a deteriorated state, etc. based on comparison with these determination values. The sense amplifier circuit SA and the row decoder/driver 2 execute the voltage applying method according to the above-described embodiments based on the determination result of the control circuit 3.

[Determination Operation 4 by Control Circuit 3]

Figure 14:
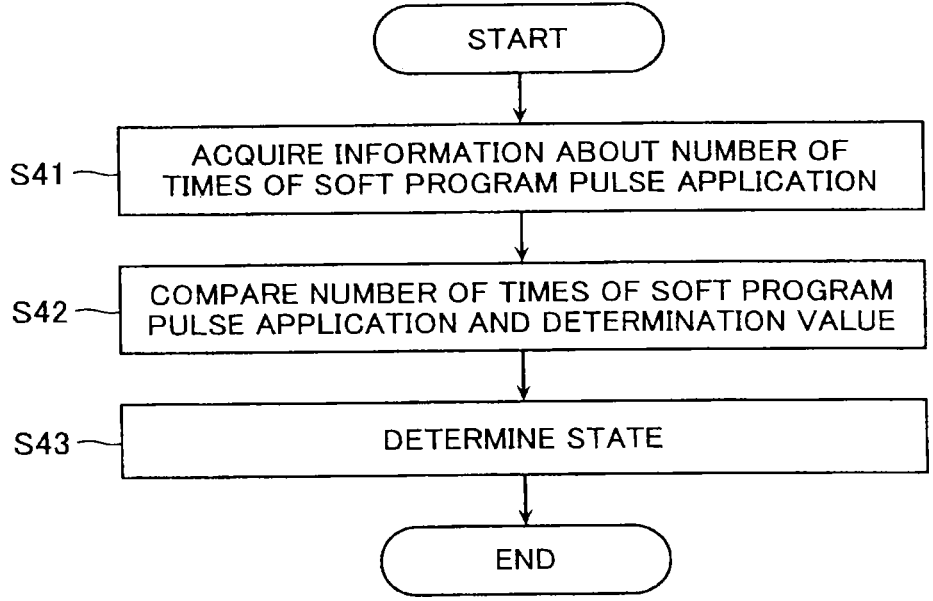
FIG. 14 is a flowchart explaining an operation of a control circuit according to an embodiment.

FIG. 14 is a flowchart explaining the operation of the control circuit 3 in the soft program operation of the NAND type flash memory according to the present embodiment. FIG. 14 shows a case that the control circuit 3 executes the determination operation based on the number of times a pulse has been applied in the soft program operation on the NAND type flash memory.

In the soft program operation, a pulse is applied plural times by incrementing the voltage value of the soft program voltage, like in the writing operation. In this soft program operation, information indicating how many times a soft program pulse has been applied is sent by the sense amplifier circuit SA and the row decoder/driver 2 to the control circuit 3. The control circuit 3 stores the number of times a pulse has been applied in the soft program operation based on this information. For example, the control circuit 3 can determine the characteristic of the dummy cells DC and memory cells MC based on the number of times a pulse has been applied in the soft program operation. This will be explained below with reference to FIG. 14.

When the determination operation by the control circuit 3 is started, the control circuit 3 acquires the information about the number of times a pulse has been applied in the soft program operation from the storage area inside the control circuit 3 (step S41). The information about the number of times a pulse has been applied in the soft program operation indicates the number of times a pulse has been applied in the last soft program operation on the block to which the soft program operation is to be executed. The control circuit 3 compares the number of times a pulse has been applied in the soft program operation with a preset determination value (step S42).

As described above, as the tunnel insulating film of the dummy cells DC and memory cells MC becomes more deteriorated, the speed of the writing operation of injecting electrons into the floating gate electrode becomes faster. Therefore, as the dummy cells DC and the memory cell MC become more deteriorated, the number of times of applying a pulse becomes smaller at the soft program operation. The control circuit 3 determines the state of the dummy cells DC and memory cells MC based on this number of times a pulse has been applied in the soft program operation and the determination value (step S43).

When the number of times a pulse has been applied in the soft program operation is smaller than a certain value, the control circuit 3 determines that the dummy cells DC and the memory cells MC are in the deteriorated state. On the other hand, when the number of times a pulse has been applied in the soft program operation is equal to or greater than the certain value, the control circuit 3 determines that the dummy cells DC and the memory cells MC are in the initial state. The control circuit 3 may have a plurality of determination values and distinguish among a plurality of states such as an initial state, a slightly deteriorated state, a deteriorated state, etc. based on comparison with these determination values. The sense amplifier circuit SA and the row decoder/driver 2 execute the voltage applying method according to the above-described embodiments based on the determination result of the control circuit 3.

The operations of the control circuit 3 for determining the characteristic of the cells have been explained. In the NAND type flash memory, the determination operation of the control circuit 3 may be any one of the operations described above or may be a combination of plural ones of them. By the way, the preset determination value may be stored in a ROM fuse in soft program circuit 32.

The operations of the embodiments described above have been explained as operations of varying the voltages to be applied to the word lines WLn and to the dummy word lines WLDS and WLDD in the soft program operation. This operation of varying the voltages to be applied to the word lines WLn and to the dummy word lines WLDS and WLDD can also be used for controlling a pre-program operation executed before an erasing operation. As a third embodiment, a pre-program operation and a control thereof performed by the NAND type flash memory will be explained below.

Third Embodiment

Configuration of Nonvolatile Semiconductor Memory Device According to Third Embodiment The nonvolatile semiconductor memory device according to the third embodiment of the present invention will be explained. The configuration of the nonvolatile semiconductor memory device according to the third embodiment is the same as the first embodiment, and hence an explanation thereof will not be provided. The nonvolatile semiconductor memory device according to the third embodiment is different from the first embodiment in using the operation of varying the voltages to be applied to the word lines WLn and to the dummy word lines WLDS and WLDD in order to control a pre-program operation executed before an erasing operation.

[Operation of Nonvolatile Semiconductor Memory Device According to Third Embodiment]

Figure 15:
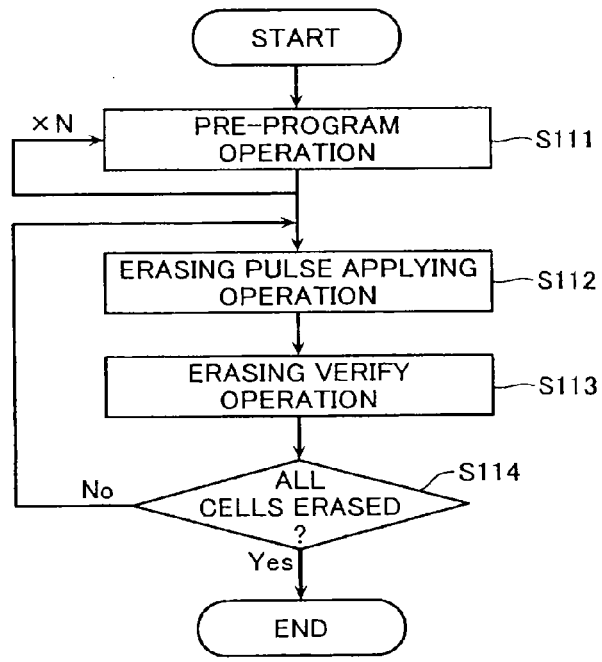
FIG. 15 is a flowchart showing an operation according to a third embodiment.

FIG. 15 is a flowchart showing the operation according to the present embodiment.

First, a pre-program operation is performed (step S111). That is, before an erasing operation is executed on the memory cells MCn and the dummy cells DC, a preliminary writing operation (a weak writing operation) for converging the threshold voltages of the respective memory cells (the memory cells MCn and the dummy cells DC) within a certain range is executed on the respective memory cells (the memory cells MCn and the dummy cells DC). The number of times N of executing the pre-program operation can be designated according to control data stored in, for example, a ROM fuse in a pre-program circuit 31. The pre-program operation according to the present embodiment will now be explained.

Figure 16:
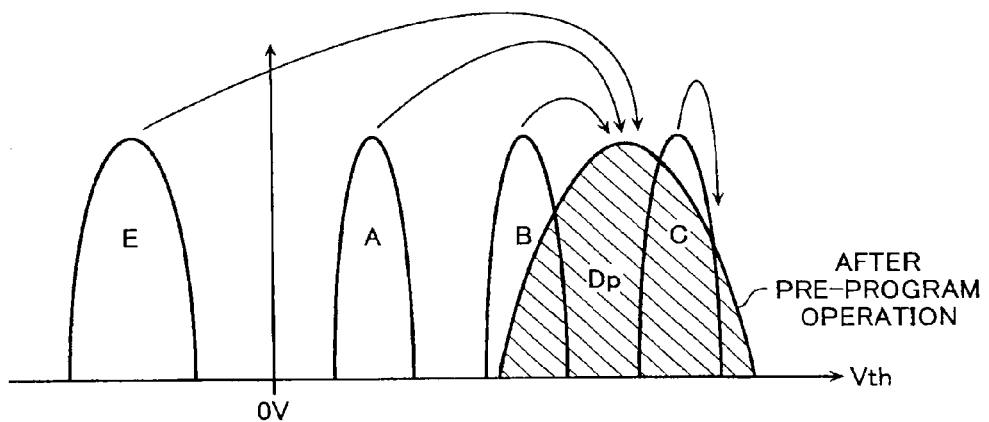
FIG. 16 is an explanatory diagram showing a concept of pre-program.

FIG. 16 is an explanatory diagram showing the concept of the pre-program operation. The example shown in FIG. 16 assumes a nonvolatile memory which stores four-value data. By applying a pre-program voltage to each memory cell, the threshold voltage distribution Dp is converged within a certain range after the pre-program operation. By executing a simultaneous erasing operation on all the memory cells after this, it is possible to optimize the erasing operation on the memory cells.

Figure 17A:
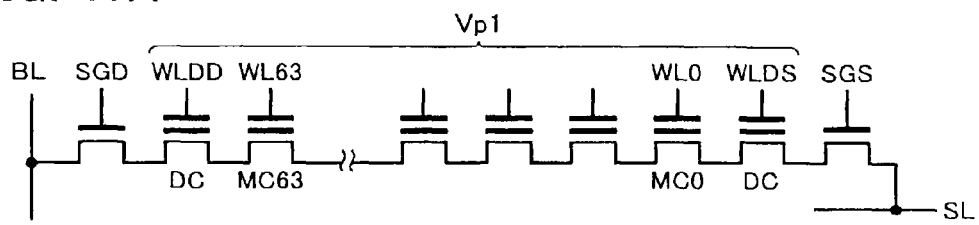
FIG. 17A is a diagram explaining pre-program according to a comparative example of the third embodiment.
Figure 17B:
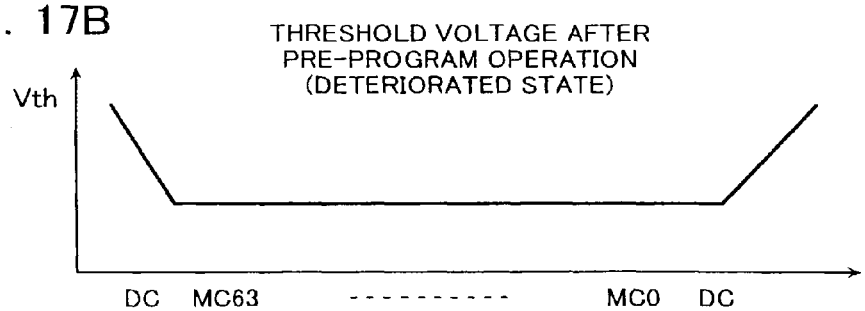
FIG. 17B is a diagram explaining pre-program according to a comparative example of the third embodiment.

FIGS. 17A and 17B are diagrams explaining a pre-program operation according to a comparative example of the present embodiment. FIG. 17A is a diagram showing a circuit configuration, and FIG. 17B is a diagram showing a threshold voltage distribution after the pre-program operation. In this comparative example, the same pre-program voltage Vp1 (e.g., 10V) is applied to the word lines WLn and to the dummy word lines WLDS and WLDD as shown in FIG. 17A.

Select transistors STS and STD are connected to the memory cells (dummy cells DC) at both ends of the memory string, respectively. Therefore, when the semiconductor device is miniaturized, the dummy cells DC receive influence from the select transistors STS and STD, and hence the threshold voltages of the dummy cells DC might become different from the threshold voltages of the other memory cells MC0 to MC63. In the example shown in FIG. 17B, the threshold voltages of the dummy cells DC are higher than the threshold voltages of the other memory cells MC0 to MC63. The phenomenon that the threshold voltages of the dummy cells DC become higher than the threshold voltages of the other memory cells MC0 to MC63 is observed after writing operations and erasing operations have been repeatedly executed. Conversely, in an initial state before writing operations and erasing operations have been repeatedly executed, a phenomenon that the threshold voltages of the dummy cells DC are lower than the threshold voltages of the other memory cells MC0 to MC63 is observed. Therefore, after a pre-program operation is executed, the threshold voltages of the memory cells at both ends of the memory string (the dummy cells DC in the present embodiment) might be different from the threshold voltages of the other memory cells (the memory cells MC0 to MC63 in the present embodiment). If such a condition occurs, it will become impossible to converge the threshold voltages of all the memory cells (the dummy cells DC and the memory cells MC0 to MC63) in the memory string within a certain range in an erasing operation to be executed later. As a result, it will become hard to execute an optimum erasing operation.

Figure 18A:
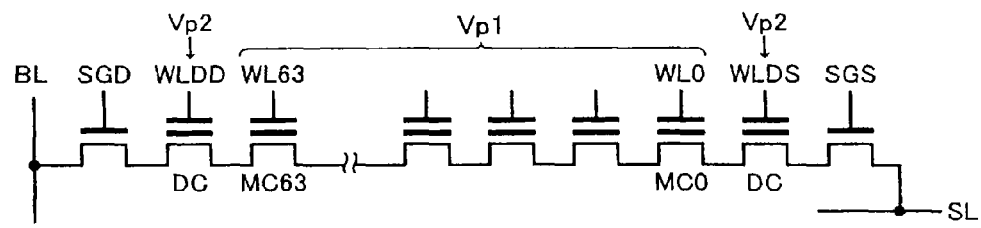
FIG. 18A is a diagram explaining pre-program according to the third embodiment.
Figure 18B:
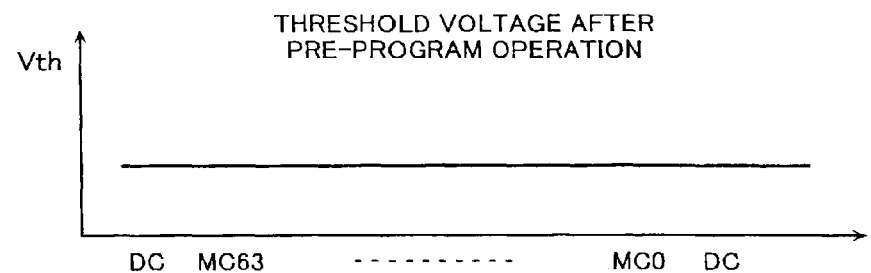
FIG. 18B is a diagram explaining pre-program according to the third embodiment.

FIG. 18A and FIG. 18B are diagrams explaining a pre-program voltage according to the present embodiment. FIG. 18A is a diagram showing a circuit configuration, and FIG. 18B is a diagram showing a threshold voltage distribution after a pre-program operation. In the present embodiment, as shown in FIG. 18A, a pre-program voltage Vp1 (e.g., 10V) is applied to the word lines WLn, and a pre-program voltage Vp2 (e.g., 9V) is applied to the dummy word lines WLDS and WLDD.

Hence, the memory cells at both ends of the memory string (the dummy cells DC in the present embodiment) are applied with a pre-program voltage different from a voltage applied to the other memory cells (the memory cells MC0 to MC63 in the present embodiment). Specifically, such pre-program voltages are applied that the threshold voltages of the dummy cells DC become substantially equal to the threshold voltages of the memory cells MC0 to MC63. As a result, as shown in FIG. 18B, the threshold voltages of all the memory cells in the memory string (the dummy cells DC and the memory cells MC0 to MC63) can become substantially equal after the pre-program operation. That is, the threshold voltages of all the memory cells in the memory string can be converged within a certain range. As a result, in a subsequent simultaneous erasing operation on all the memory cells, the erasing operation can be executed securely.

As described above, after writing operations and erasing operations have been executed repeatedly, the threshold voltages of the memory cells at both ends of the memory string (the dummy cells DC in the present embodiment) tend to be higher than the threshold voltages of the other memory cells (the memory cells MC0 to MC63 in the present embodiment). Conversely, in an initial state before writing operations and erasing operations have been executed repeatedly, the threshold voltages of the memory cells at both ends of the memory string tend to be lower than the threshold voltages of the other memory cells. That is, as the number of times writing/erasing operations have been executed increases, ease of shift of the threshold voltages of the memory cells at both ends of the memory string gradually change. Therefore, it is preferable that the pre-program voltage can be varied according to the shift of the threshold voltages of the memory cells at both ends of the memory string.

Specifically, the total number of times writing operations and erasing operations have been executed is counted (for example, a counter is provided in the control circuit 3 or the pre-program circuit 31), and the pre-program voltage is varied according to the counted number. That is, an optimum pre-program voltage is set according to the counted number. Specifically, a relationship between the number of writing operations and erasing operations counted from an initial state and an amount of shift of the threshold voltages from the initial state is derived in advance, and the relationship is set in a table in the control circuit 3 or the pre-program circuit 31. Then, an optimum pre-program voltage is set with reference to the table.

Alternatively, data such as the number of times of loops (the number of times of step-ups) in a writing operation, the number of times of loops (the number of times of step-ups) in an erasing operation, etc. may be stored, and the pre-program voltage may be varied by determining the degree of deterioration of the memory cells based on such data.

As shown in FIG. 15, after the pre-program operation, an erasing pulse applying operation is executed on the memory cells MCn and the dummy cells DC (step S112). That is, the same erasing pulse voltage is applied to all the memory cells in the memory string (the memory cells MCn and the dummy cells DC). In the present embodiment, an optimum erasing operation can be executed since the threshold voltages of all the memory cells in the memory string (the memory cells MCn and the dummy cells DC) have been converged within a certain range.

After the erasing operation is executed, a verify operation is executed on the memory cells MCn and the dummy cells DC (step S113). Then, it is determined whether or not a certain condition is satisfied as a result of the verify operation (step S114). Specifically, it is determined whether or not the erasing operation has been executed properly on all the memory cells (the memory cells MCn and the dummy cells DC). When the certain condition is not satisfied, the flow returns to step S112, and an erasing operation is executed again.

When the certain condition is satisfied, the erasing operation and a series of operations following the erasing operation are completed.

As described above, according to the present embodiment, the memory cells at both ends of the memory string are applied with a pre-program voltage different from the voltage applied to the other memory cells. Therefore, after the pre-program operation is executed, the threshold voltages of all the memory cells in the memory string can be converged within a certain range. As a result, an optimum erasing operation can be executed, and a semiconductor device (nonvolatile semiconductor memory) having a high reliability can be obtained.

Modification Example 1 of Third Embodiment

Figure 19:
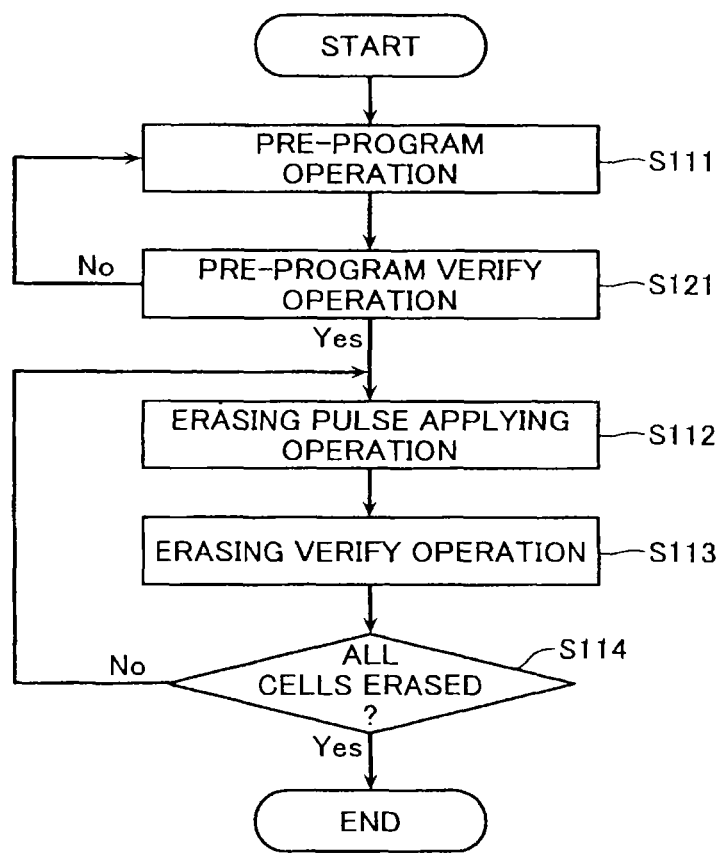
FIG. 19 is a flowchart showing an operation according to a first modification example of the third embodiment.

FIG. 19 is a flowchart showing an operation according to a first modification example of the present embodiment. The basic operation is the same as the operation shown in FIG. 15, and explanation about any matters already described with reference to FIG. 15 will not be provided.

In the present modification example, after a pre-program operation is executed, a verify operation is executed on the memory cells MCn and the dummy cells DC (step S121). Then, it is determined whether or not a certain condition is satisfied as a result of the verify operation. Specifically, it is determined whether or not the threshold voltages of all the memory cells in the memory string (the dummy cells DC and the memory cells MC0 to MC63) have been converged within a certain range. When the certain condition is not satisfied, the flow returns to step S111, and the pre-program operation is executed again.

The verify operation may be executed only on the memory cells at both ends of the memory string (the dummy cells DC in the present embodiment). As can be understood from the description given above, the threshold voltages of the memory cells at both ends of the memory string greatly shift. Therefore, even if a verify operation is executed only on the memory cells at both ends of the memory string, it can be expected that a verify result having a certain degree of properness can be obtained. In this way, by executing the verify operation only on the memory cells at both ends of the memory string, it is possible to shorten the verify time.

When it is determined that the certain condition is satisfied as a result of the verify operation after the pre-program operation, an erasing pulse applying operation is executed on the memory cells MCn and the dummy cells DC (step S112). The following operations are the same as the flowchart shown in FIG. 15.

Modification Example 2 of Third Embodiment

Figure 20:
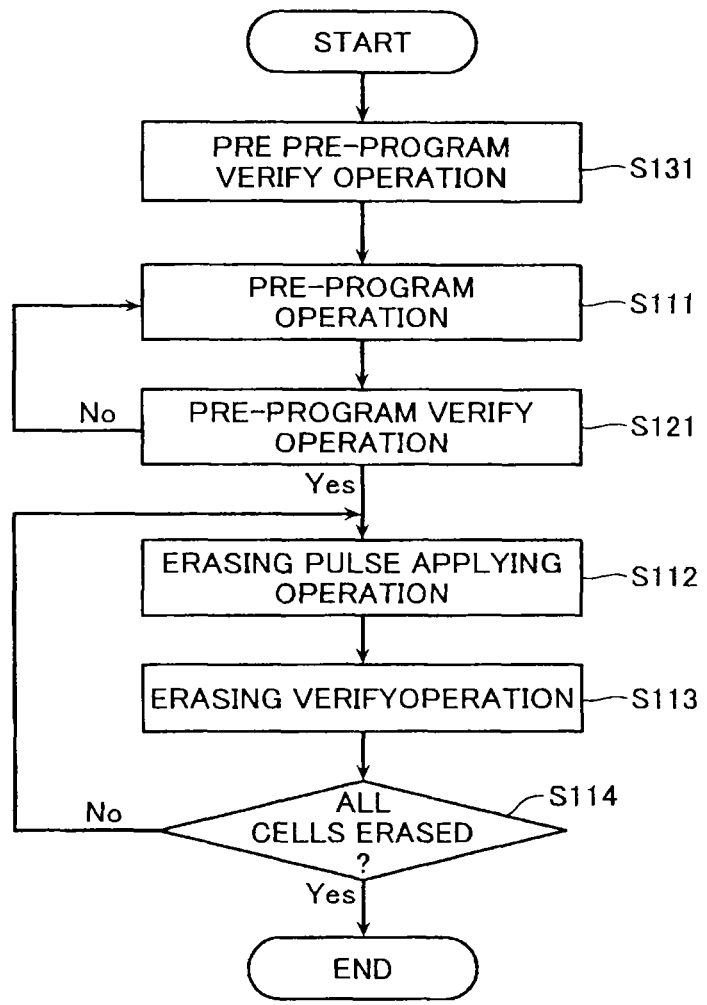
FIG. 20 is a flowchart showing an operation according to a second modification example of the third embodiment.

FIG. 20 is a flowchart showing an operation according to a second modification example of the present embodiment. The basic operation is the same as the operation shown in FIG. 15 and FIG. 19, and explanation about any matters already described with reference to FIG. 15 and FIG. 19 will not be provided.

In the present modification example, before a pre-program operation is executed, a pre-pre-program verify operation is executed on the memory cells MCn and the dummy cells DC (step S131). Specifically, the threshold voltages of the memory cells at both ends of the memory string are measured before a pre-program operation is executed, so that the pre-program voltage may be changed according to the measurement result. That is, an optimum pre-program voltage is set according to the measurement result. The pre-pre-program verify operation may be executed at different verify levels, to ensure a more appropriate determination of the threshold voltages. That is, two or more times of pre-pre-program verify operations may be executed. The following operations are the same as the flowchart shown in FIG. 19.

Modification Example 3 of Third Embodiment

Figure 21:
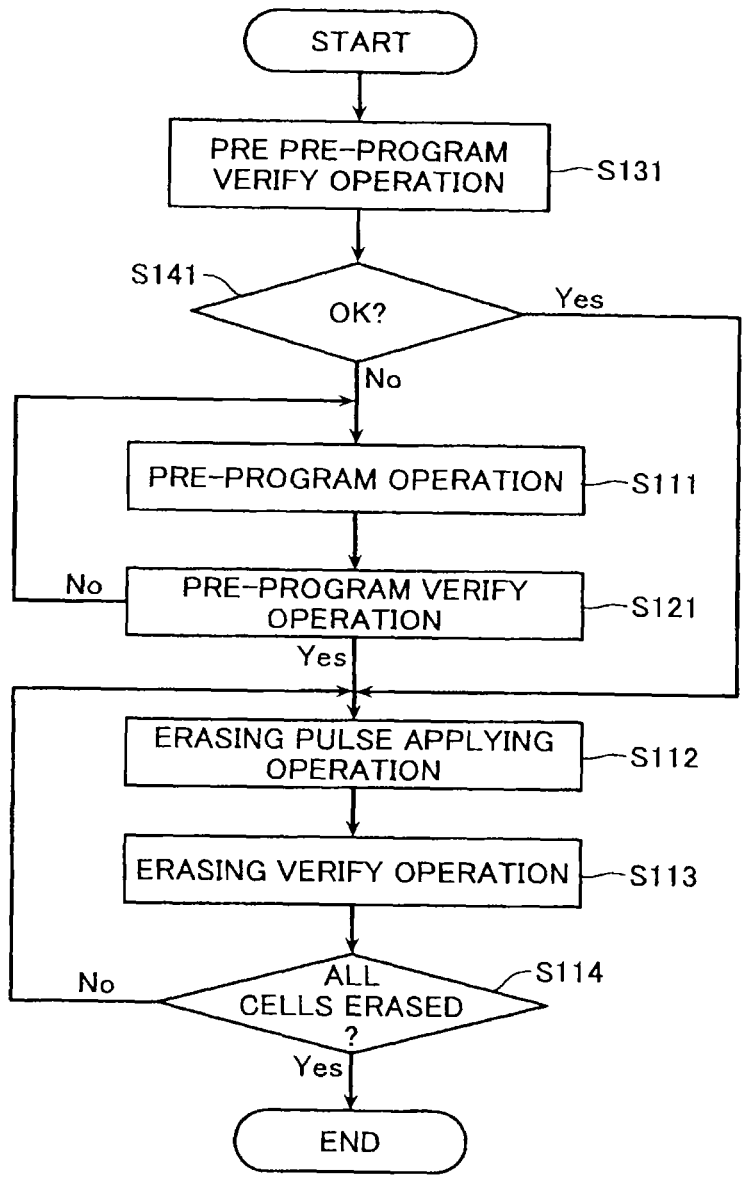
FIG. 21 is a flowchart showing an operation according to a third modification example of the third embodiment.

FIG. 21 is a flowchart showing an operation according to a third modification example of the present embodiment. The basic operation is the same as the operation shown in FIG. 15, FIG. 19, and FIG. 20, and explanation about any matters already described with reference to FIG. 15, FIG. 19, and FIG. 20 will not be provided.

In the present modification example, before a pre-program operation is executed, a pre-pre-program verify operation is executed on the memory cells MCn and the dummy cells DC (step S131). Then, it is determined whether or not a certain condition is satisfied as a result of the verify operation, i.e., whether or not a pre-program operation need to be executed (step S141). Specifically, it is determined whether or not the threshold voltages of all the memory cells in the memory string (the dummy cells DC and the memory cells MCn) are converged within a certain range. When it is determined that the certain condition is satisfied, the pre-program operation is not executed and the flow goes to step S112. The operations following the pre-program operation (step S111) are the same as the flowchart shown in FIG. 19.

In the present modification example, it is possible to prevent a writing stress and a time loss that would be caused by an unnecessary pre-program operation.

Modification Example 4 of Third Embodiment

Figure 22:
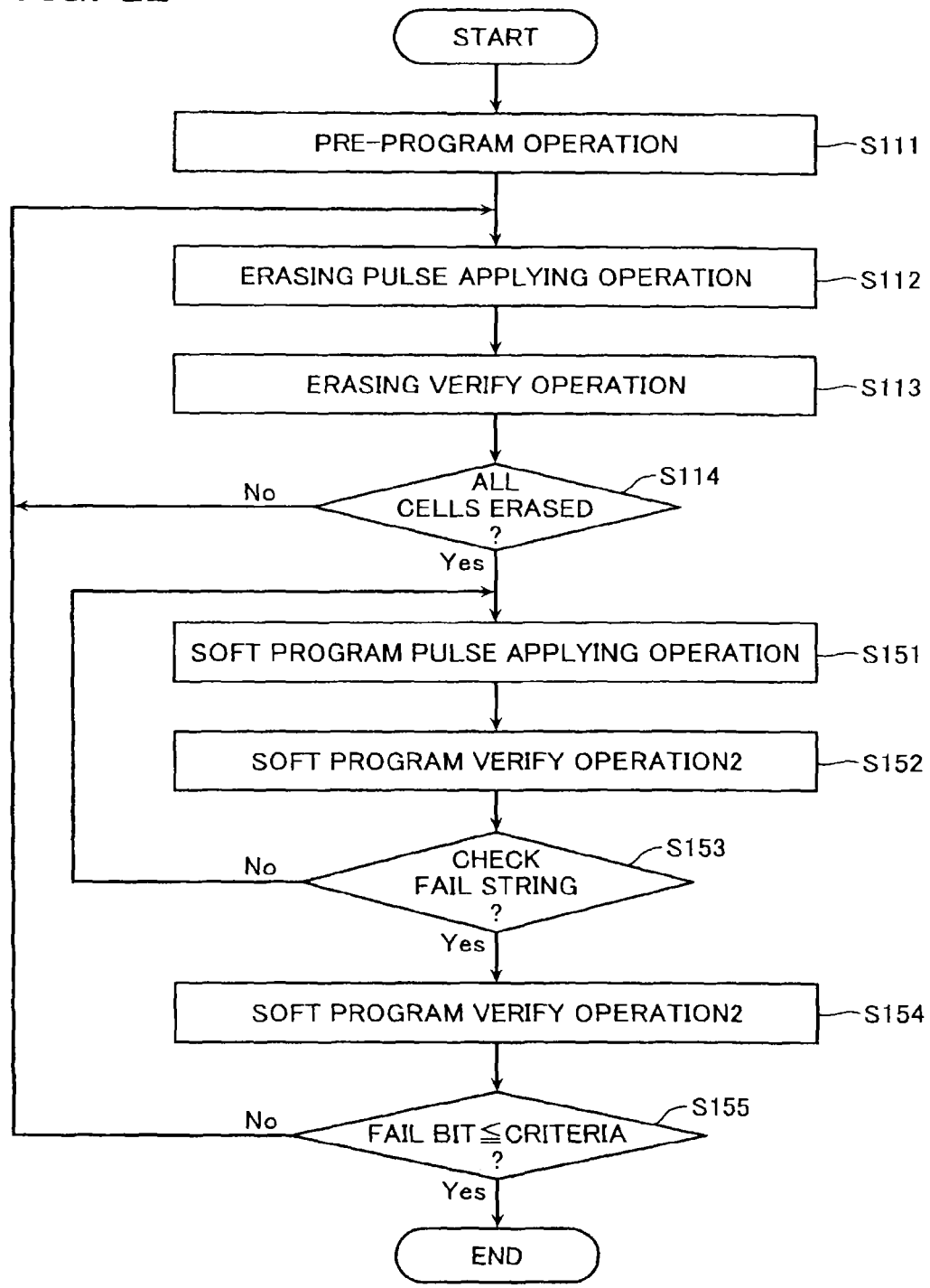
FIG. 22 is a flowchart showing an operation according to a fourth modification example of the third embodiment.

FIG. 22 is a flowchart showing an operation according to a fourth modification example of the present embodiment. The basic operation is the same as the operation shown in FIG. 15, and explanation about any matters already described with reference to FIG. 15 will not be provided. The matters described in the first to third modification examples may be combined with the present example.

In the present modification example, after the processes up to step S114 are executed in the same way as FIG. 15, a soft program pulse applying operation is executed on the memory cells MCn and the dummy cells DC (step S151). That is, after an erasing operation is executed on the memory cells MCn and the dummy cells DC, a preliminary writing operation (a weak writing operation) for converging the threshold voltages of the respective memory cells (the memory cells MCn and the dummy cells DC) within a certain narrower range is executed on the memory cells (the memory cells MCn and the dummy cells DC).

After the soft program operation is executed, a first soft program verify operation is executed on the memory cells MCn and the dummy cells DC (step S152). Then, it is determined whether or not a certain condition is satisfied as a result of the verify operation (step S153). Specifically, it is determined whether or not there is any string on which the soft program operation has not been executed properly. When the certain condition is not satisfied, the flow returns to step S151 and the soft program operation is executed again.

When it is determined that the certain condition is satisfied as a result of the first soft program verify operation, a second soft program verify operation is executed on the memory cells MCn and the dummy cells DC (step S154). Then, it is determined whether or not a certain condition is satisfied as a result of the verify operation (step S155). Specifically, it is determined whether or not the number of bits on which the soft program operation has not been executed properly is smaller than a criterion value. When the certain condition is not satisfied, the flow returns to step S112, and the erasing operation is executed again. When the certain condition is satisfied, the series of operations is completed.

In the embodiment described above, the memory cells at both ends of the memory string are dummy cells which are not used for an actual storage operation. However, it is not necessary that they are dummy cells, but they may be memory cells used for an actual storage operation. Also in this case, the same effect as described above can be obtained.

In the embodiment described above, only the memory cells at the very ends of the memory string are applied with a pre-program voltage different from the voltage to be applied to the other memory cells. However, a plurality of memory cells including the memory cells at the very ends may be applied with a pre-program voltage different from the voltage to be applied to the other memory cells. Furthermore, memory cells other than those at the very ends of the memory string may be applied with a pre-program voltage different from the voltage to be applied to the other memory cells. Generally, it is possible that at least one memory cell in the memory string is applied with a pre-program voltage different from a pre-program voltage to be applied to the other memory cell in the memory string. In this case, it is possible to vary the pre-program voltage to be applied to such at least one nonvolatile memory cell.

[Others]

Though the embodiments of the invention have been explained, the present invention is not limited to these embodiments, but various alterations, additions, combinations, etc. can be made thereto within the scope of spirit of the invention. For example, the memory cell array may be configured with no dummy cells DC provided at the ends of the NAND cell unit 1. The explanation of the embodiments given above will apply to this case of no dummy cells DC being provided, if the dummy cells DC are read as memory cells MC0 and MC63 and the dummy word lines WLDS and WLDD are read as word lines WL0 and WL63.

It is only necessary that the number of memory cells MCn connected in series between the select transistors STD and STS should be a plural number (a power of two), which is not limited to 64. In the above explanation, the data stored in a memory cell is binary data or four-value data, but it may be data of any other value (e.g., eight-value data).

The present invention can also be applied to a case that there is a dummy cell DC provided at only the side of either the drain-side select gate line SGD or the source-side select gate line SGS of the NAND cell unit 1. Moreover, there may be not only a single dummy cell DC but two or more dummy cells DC provided at each end of the NAND cell unit 1. In this case, the present invention may be applied to only the dummy cells DC that adjoin the drain-side select gate line SGD and the source-side select gate line SGS or may be applied to all the dummy cells DC.

What is claimed is:

1. A nonvolatile semiconductor memory device, comprising
   a memory cell array configured as an arrangement of NAND cell units each including a memory string and select transistors connected to both ends of the memory string respectively, the memory string including a plurality of nonvolatile memory cells connected in series;
   word lines connected to control gate electrodes of the nonvolatile memory cells;
   bit lines connected to first ends of the NAND cell units;
   a source line connected to second ends of the NAND cell units; and
   a control circuit configured to perform a pre-program operation before an erasing operation for the NAND cell units arranged in a block, the NAND cell units that share the word lines forming the block, and to perform an erasing verify operation after the erasing operation for the NAND cell units to check whether or not the nonvolatile memory cells in the NAND cell units have been erased,
   the control circuit being configured to execute the erasing operation by applying an erasing voltage to the NAND cell units in the block, to execute the pre-program operation by applying a certain pre-program voltage to first nonvolatile memory cells in the NAND cell units, and by applying a voltage different from the certain pre-program voltage to second nonvolatile memory cells in the NAND cell units, the second nonvolatile memory cells including at least nonvolatile memory cells at the both ends of the memory string, and to execute the erasing verify operation by applying a certain voltage to all the word lines connected to the control gate electrodes of the first nonvolatile memory cells in the NAND cell units,
   wherein the certain pre-program voltage is applied to first word lines connected to the control gate electrodes of the first nonvolatile memory cells, and the voltage different from the certain pre-program voltage is applied to second word lines connected to the control gate electrodes of the second nonvolatile memory cells, and
   among the nonvolatile memory cells, the nonvolatile memory cells provided at the both ends of the memory string are dummy cells which are not used for data storage, and the second word lines include dummy word lines connected to the control gate electrodes of the dummy cells.

2. The nonvolatile semiconductor memory device according to claim 1, wherein the certain pre-program voltage has a higher positive value than the voltage different from the certain pre-program voltage.

3. The nonvolatile semiconductor memory device according to claim 1, wherein the erasing voltage is simultaneously applied to the first nonvolatile memory cells and the second nonvolatile memory cells.

4. The nonvolatile semiconductor memory device according to claim 3, wherein a positive boosted voltage as the erasing voltage is applied to a well in which both the first nonvolatile memory cells and the second nonvolatile memory cells are formed.

5. The nonvolatile semiconductor memory device according to claim 4, wherein a word line voltage is applied to the first word lines while the positive boosted voltage is applied to the well, and the word line voltage has a same value as the certain voltage applied to all the word lines connected to the control gate electrodes of the first nonvolatile memory cells in the erasing verify operation.

6. The nonvolatile semiconductor memory device according to claim 1, wherein the control circuit is configured to perform a writing operation for the NAND cell units and to be capable of varying a voltage value applied to the NAND cell units based on number of times the writing operation or the erasing operation has been performed.

7. The nonvolatile semiconductor memory device according to claim 6, wherein the control circuit is configured to be capable of varying a voltage value applied to at least one of the word lines connected to the control gate electrodes of the nonvolatile memory cells based on a number of times the writing operation or the erasing operation has been performed.

8. The nonvolatile semiconductor memory device according to claim 1, wherein the first nonvolatile memory cells are configured to be capable of storing multi-bit data.

9. A nonvolatile semiconductor memory device, comprising
a memory cell array configured as an arrangement of NAND cell units each including a memory string and select transistors connected to both ends of the memory string respectively, the memory string including a plurality of nonvolatile memory cells connected in series;
word lines connected to control gate electrodes of the nonvolatile memory cells;
bit lines connected to first ends of the NAND cell units;
a source line connected to second ends of the NAND cell units; and
a control circuit configured to perform a pre-program operation before an erasing operation for the NAND cell units arranged in a block, the NAND cell units that share the word lines forming the block, and to perform an erasing verify operation after the erasing operation for the NAND cell units to check whether or not the nonvolatile memory cells in the NAND cell units have been erased,
the control circuit being configured to execute the erasing operation by applying an erasing voltage to the NAND cell units in the block, to execute the pre-program operation by applying a first gate voltage to first nonvolatile memory cells in the NAND cell units, and by applying a second gate voltage different from the first gate voltage to second nonvolatile memory cells in the NAND cell units, the second nonvolatile memory cells including at least nonvolatile memory cells at the both ends of the memory string, and to execute the erasing verify operation by applying a certain gate voltage to the first nonvolatile memory cells in the NAND cell units wherein the first gate voltage is applied to first word lines connected to the control gate electrodes of the first nonvolatile memory cells, and the second gate voltage is applied to second word lines connected to the control gate electrodes of the second nonvolatile memory cells, and
among the nonvolatile memory cells, the nonvolatile memory cells provided at the both ends of the memory string are dummy cells which are not used for data storage, and the second word lines include dummy word lines connected to the control gate electrodes of the dummy cells.

10. The nonvolatile semiconductor memory device according to claim 9, wherein the first gate voltage has a higher positive value than the second gate voltage.

11. The nonvolatile semiconductor memory device according to claim 9, wherein the erasing voltage is simultaneously applied to the first nonvolatile memory cells and the second nonvolatile memory cells.

12. The nonvolatile semiconductor memory device according to claim 11, wherein a positive boosted voltage as the erasing voltage is applied to a well in which both the first nonvolatile memory cells and the second nonvolatile memory cells are formed.

13. The nonvolatile semiconductor memory device according to claim 12, wherein a word line voltage is applied to the first word lines while the positive boosted voltage is applied to the well, and the word line voltage has a same value as the certain gate voltage applied to the first nonvolatile memory cells in the erasing verify operation.

14. The nonvolatile semiconductor memory device according to claim 9, wherein the control circuit is configured to perform a writing operation for the NAND cell units and to be capable of varying a voltage value applied to the NAND cell units based on a number of times the writing operation or the erasing operation has been performed.

15. The nonvolatile semiconductor memory device according to claim 14, wherein the control circuit is configured to be capable of varying a voltage value applied to at least one of the word lines connected to the control gate electrodes of the nonvolatile memory cells based on number of times the writing operation or the erasing operation has been performed.

16. The nonvolatile semiconductor memory device according to claim 9,
wherein the first nonvolatile memory cells are configured to be capable of storing multi-bit data.

* * * * *